US012713535B2

(12) United States Patent
Tanaka et al.

(10) Patent No.: US 12,713,535 B2
(45) Date of Patent: Aug. 18, 2026

(54) CIRCUIT BOARD AND MANUFACTURING METHOD

(71) Applicant: NHK SPRING CO., LTD., Yokohama (JP)

(72) Inventors: Ryo Tanaka, Yokohama (JP); Yuichiro Yamauchi, Yokohama (JP); Kohei Suzuki, Yokohama (JP)

(73) Assignee: NHK Spring Co., Ltd., Yokohama (JP)

( * ) Notice: Subject to any disclaimer, the term of this patent is extended or adjusted under 35 U.S.C. 154(b) by 411 days.

(21) Appl. No.: 18/546,088

(22) PCT Filed: Jan. 27, 2022

(86) PCT No.: PCT/JP2022/003154
§ 371 (c)(1),
(2) Date: Aug. 10, 2023

(87) PCT Pub. No.: WO2022/172767
PCT Pub. Date: Aug. 18, 2022

(65) Prior Publication Data

US 2024/0136325 A1 Apr. 25, 2024
US 2024/0234366 A9 Jul. 11, 2024

(30) Foreign Application Priority Data

Feb. 12, 2021 (JP) ................................ 2021-020504

(51) Int. Cl.
*H05K 1/183* (2026.01)
*H05K 1/185* (2026.01)
(Continued)

(52) U.S. Cl.
CPC ............ *H05K 1/183* (2013.01); *H05K 1/186* (2013.01); *H05K 3/346* (2026.01); *H10W 70/60* (2026.01);
(Continued)

(58) Field of Classification Search
CPC ...... H05K 3/3463; H05K 1/0209; H05K 3/24; H05K 1/183; H05K 1/186; H05K 3/0061;
(Continued)

(56) References Cited

U.S. PATENT DOCUMENTS 4,151,543 A * 4/1979 Hayakawa ............ H01L 23/145 257/772
6,204,454 B1 * 3/2001 Gotoh ................. H01L 23/5383 428/209
(Continued)

FOREIGN PATENT DOCUMENTS

JP 5-235117 A 9/1993
JP 2002-012653 A 1/2002
(Continued)

*Primary Examiner* — Mouloucoulaye Inoussa
(74) *Attorney, Agent, or Firm* — Norris McLaughlin, P.A.

(57) ABSTRACT

A circuit board having a circuit pattern on a base plate and an additional metal layer laid and bonded on the circuit pattern, wherein the additional metal layer comprises an attachment plane portion configured to fix a semiconductor chip using solder, and an engagement uneven portion provided adjacent to the attachment plane portion, wherein the attachment plane portion is a face having unevenness smaller than the engagement uneven portion.

17 Claims, 15 Drawing Sheets

(51) Int. Cl.

*H05K 3/346* (2026.01)
*H10W 70/60* (2026.01)
*H10W 72/00* (2026.01)
*H10W 72/30* (2026.01)
*H10W 72/90* (2026.01)
*H10W 90/00* (2026.01)

(52) U.S. Cl.

CPC ................ *H10W 72/07141* (2026.01); *H10W 72/07333* (2026.01); *H10W 72/387* (2026.01); *H10W 72/923* (2026.01); *H10W 72/931* (2026.01); *H10W 72/932* (2026.01); *H10W 90/734* (2026.01)

(58) Field of Classification Search

CPC .. H05K 1/188; H05K 1/181; H05K 2201/066; H05K 2201/0373; H05K 2201/10553; H05K 2203/0292; H05K 2201/2072; H05K 2201/09745; H05K 2201/10969; H05K 2203/0285; H05K 2201/10598; H05K 2203/0307; H01L 24/32; H01L 24/83; H01L 23/498; H01L 24/75; H01L 23/3737; H01L 23/3735; H01L 24/48; H01L 23/49838; H01L 25/0655; H01L 23/66; H01L 23/16; H01L 21/565; H01L 23/4334; H01L 24/06; H01L 23/3128; H01L 23/552; H01L 23/3121; H01L 21/4853; H01L 24/13; H01L 23/24; H01L 24/29; H01L 25/07; H01L 25/072; H01L 23/48; H01L 23/49562; H01L 2224/75353; H01L 2224/83385; H01L 2924/3511; H01L 2224/83205; H01L 2224/32225; H01L 2224/26175; H01L 2224/05014; H01L 2224/85455; H01L 2223/6677; H01L 2224/32105; H01L 2924/15311; H01L 2224/85444; H01L 2924/19107; H01L 2224/48091; H01L 2924/13091; H01L 2924/3512; H01L 2224/32227; H01L 2224/48175; B23K 1/0016; B23K 20/10; B23K 1/20; B23K 2101/42; H01Q 1/2283; H01Q 1/40; H01Q 1/52

See application file for complete search history.

(56) References Cited

U.S. PATENT DOCUMENTS 6,523,734 B1* 2/2003 Kawai .................... H01R 12/52 228/110.1
7,049,683 B1* 5/2006 Sirinorakul ........... H01L 23/495 257/667
2005/0169620 A1* 8/2005 Minamio ................ H10F 77/50 257/E31.118
2006/0180635 A1* 8/2006 Lim ....................... B23K 20/10 228/110.1
2006/0258055 A1 11/2006 Okamoto
2007/0252249 A1* 11/2007 Murai ..................... H01L 24/48 257/666
2009/0039486 A1* 2/2009 Shimazaki .............. H01L 24/97 29/829
2011/0042797 A1* 2/2011 Park ........................ H01L 23/13 257/E23.06
2013/0093075 A1* 4/2013 Liu ......................... H01L 23/42 438/126
2014/0001620 A1* 1/2014 Shimizu .................. H01L 24/97 257/676
2016/0133712 A1 5/2016 Yoneda et al.
2016/0315054 A1* 10/2016 Kajihara ........... H01L 23/49513
2018/0197802 A1* 7/2018 Nagamatsu ....... H01L 23/49548
2019/0054562 A1 2/2019 Miyashiro
2020/0035642 A1 1/2020 Egusa et al.
2020/0176342 A1* 6/2020 Choi ................. H01L 23/49524
2020/0343196 A1* 10/2020 Tsai ..................... H01Q 1/2283
2021/0305175 A1* 9/2021 Abe ........................ H01L 24/85
2022/0208659 A1* 6/2022 Tea ....................... H01L 21/565
2023/0317569 A1* 10/2023 Tea ..................... H01L 23/3114 257/676
2024/0063096 A1* 2/2024 Tanaka .................... H01L 24/32

FOREIGN PATENT DOCUMENTS

JP 2002-050730 A 2/2002
JP 2006-245171 A 9/2006
JP 2006-319146 A 11/2006
JP 2007-123937 A 5/2007
JP 2010-123680 A 6/2010
JP 2016-096172 A 5/2016
JP 2018-142570 A 9/2018
WO 2018/143410 A1 8/2018

* cited by examiner

FIG.11
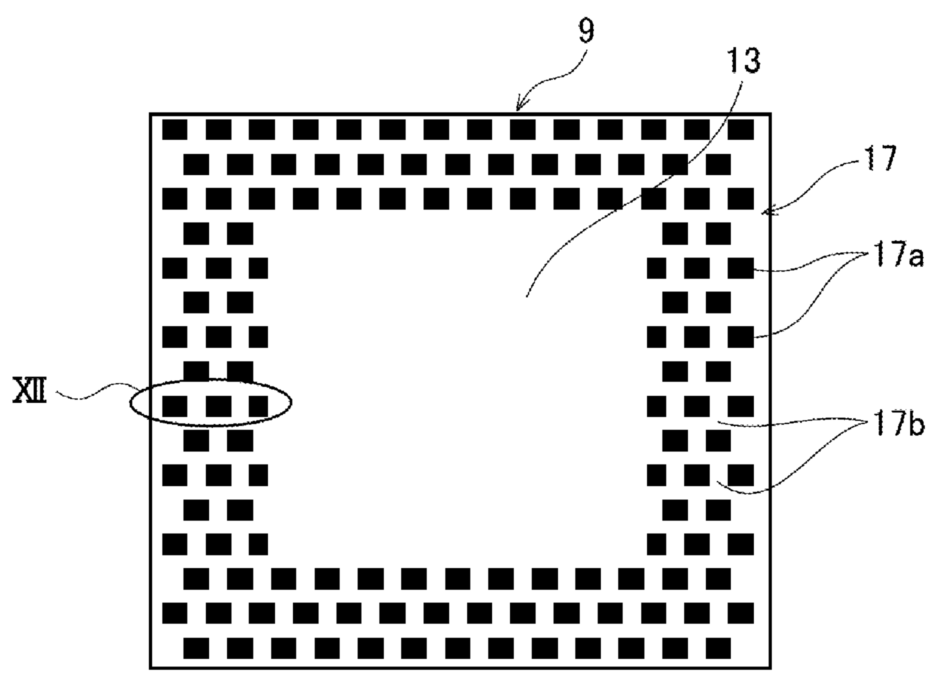
FIG.12A
FIG.12B
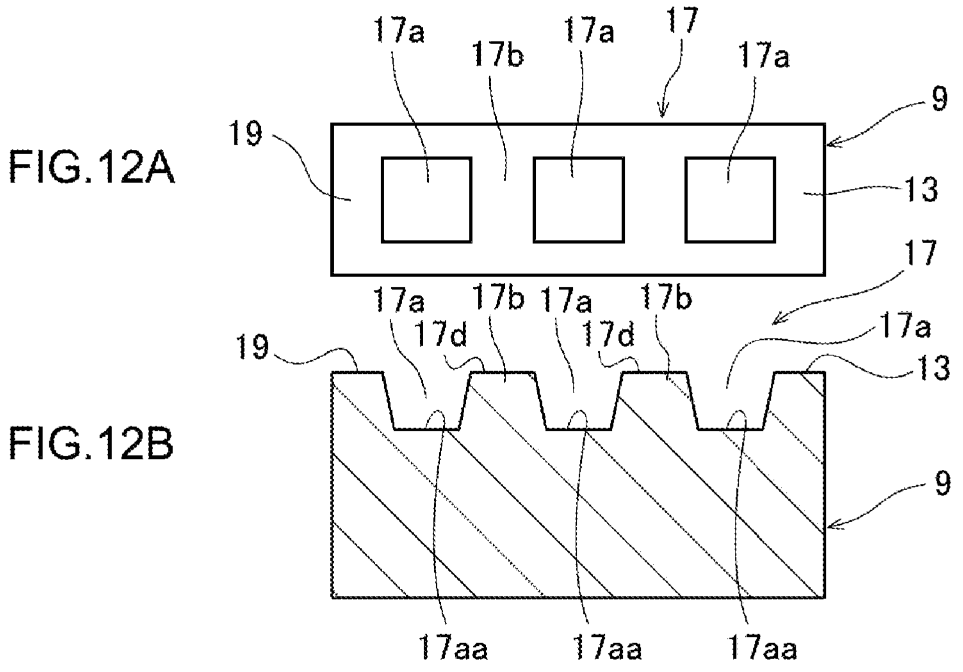

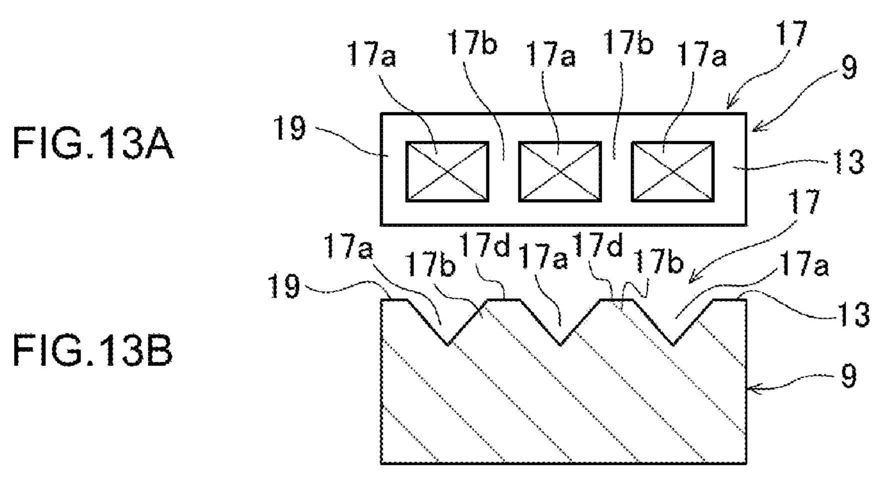
FIG.13A
FIG.13B
17a
17b
17a
17b
17a
17
9
19
13
17
17a
17d
17a
17d
17b
17b
17a
19
13
9
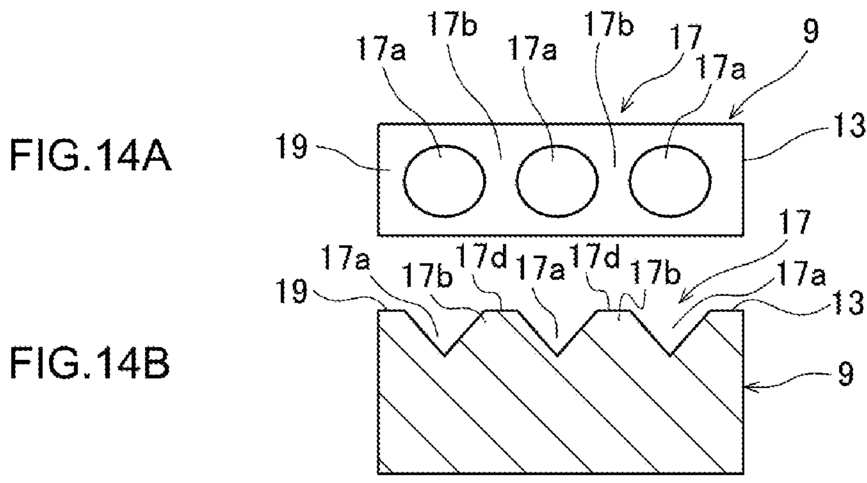
FIG.14A
FIG.14B
17a
17b
17a
17b
17
9
17a
19
13
17
17a
17d
17a
17d
17b
17b
17a
19
13
9
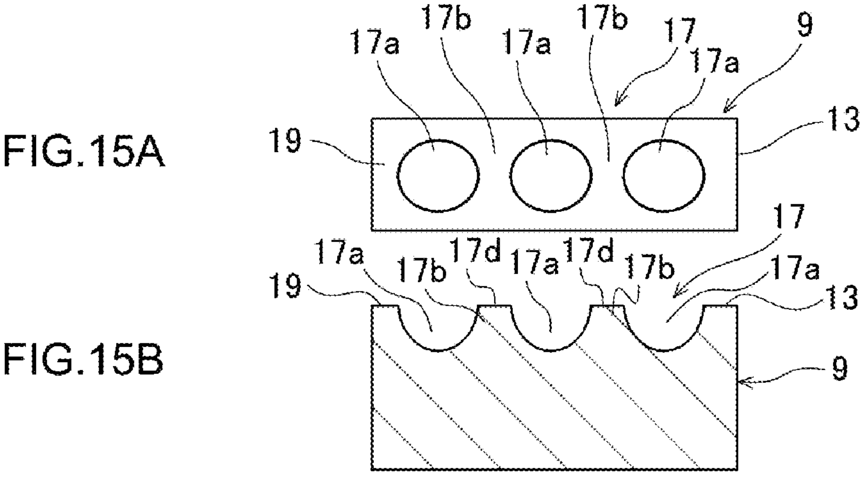
FIG.15A
FIG.15B
17a
17b
17a
17b
17
9
17a
19
13
17
17a
17d
17a
17d
17b
17b
17a
19
13
9

FIG.16
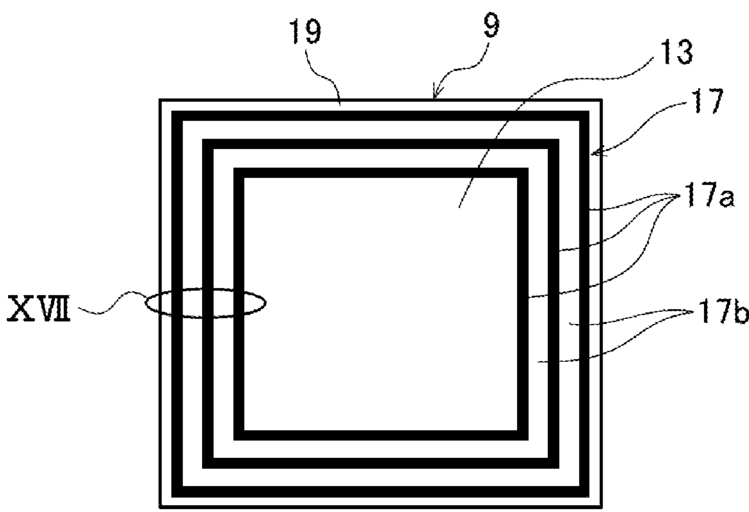
FIG.17A
FIG.17B
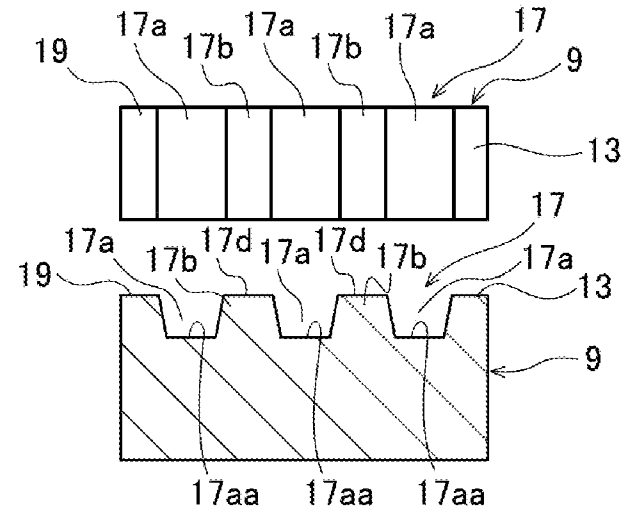
FIG.18A
FIG.18B
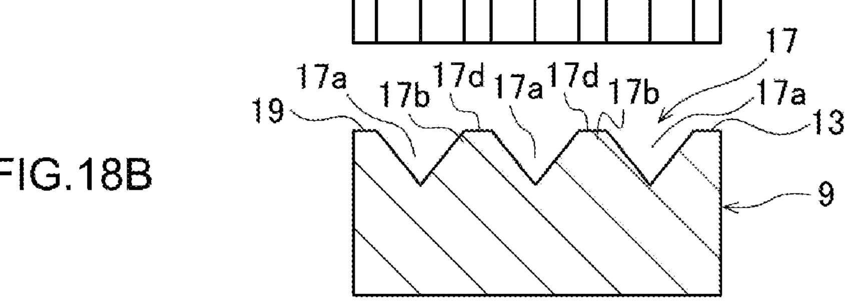

CIRCUIT BOARD AND MANUFACTURING METHOD

FIELD OF THE INVENTION

The present invention relates to a circuit board and a manufacturing method used for manufacturing the same.

BACKGROUND OF THE INVENTION

In recent years, needs for large current of a power device increase more and more and needs for cost reduction of a semiconductor increase at the same time. According to this, it is required for development of a circuit board applicable to large current with low cost.

There is one disclosed in Patent document 1 as a conventional circuit board.

A circuit pattern of the circuit board is formed by wet etching conducted to a cupper foil (Cu foil) or an aluminum foil (Al foil).

For large current and the like, it is important that the Cu foil is made thick to effectively dissipate heat of electronic components such as semiconductor chip mounted on the circuit pattern. If the Cu foil is made thick, processing time for the etching is elongated to also deteriorate dimensional accuracy of the circuit pattern.

In contrast, in a circuit board disclosed in Patent document 2, a stacked circuit pattern is formed by a cold spray method on a circuit pattern formed by etching conducted to a Cu foil. The circuit board increase heat dissipation according to the stacking that makes the circuit pattern partly thick while suppressing processing time for the etching.

The cold spray method is, however, a technique to form a coat by colliding particles of thermal spray material in a solid phase with a base material at high speed. Accordingly, large residual stress and thermal stress tend to be generated in a Cu layer of the stacked circuit pattern, and there is concern over a curve of the board. Further, powder is used for raw material to increase the cost.

In contrast, an ultrasonic bonding technique disclosed in Patent document 3 may be diverted to stack and bond a metal layer such as additional Cu foil on a circuit pattern such as a Cu foil. The bonding technique is to add ultrasonic vibration in a planar direction of an interface against a circuit pattern while pressing an electrode terminal using an ultrasonic horn, to bond the electrode terminal to the circuit pattern according to the ultrasonic vibration.

If the ultrasonic bonding technique is simply diverted, ultrasonic vibration is added in a planar direction of an interface while pressing the additional metal layer using the ultrasonic horn, to bond the metal layer to the circuit pattern.

It is, therefore, advantageous that a curve of the board is hard to be caused unlike the cold spray method of Patent document 2 and expensive powder is not used.

Tool marks (grooves) are, however, left by the pressing of the ultrasonic horn on a surface of the additional metal layer including a mounting surface for an electronic component. Accordingly, mounting an electronic component on the additional metal layer using solder, the solder with low heat conductivity is accumulated and additionally stayed in the tool marks to limit improvement of heat dissipation of the electronic component.

PATENT DOCUMENT 1: JP 2002-012653 A
PATENT DOCUMENT 2: JP 2006-319146 A
PATENT DOCUMENT 3: JP 2016-096172 A

SUMMARY OF THE INVENTION

A problem to be solved is that, if an additional metal layer is bonded to a circuit pattern by ultrasonic bonding and an electronic component is mounted on the additional metal layer using solder, it limits improvement of heat dissipation of the electronic component.

A circuit board according to the present invention is a circuit board comprising a circuit pattern on a base plate and an additional metal layer layered and bonded on the circuit pattern, wherein the additional metal layer comprises an attachment plane portion configured to fix an electronic component using solder, and an engagement uneven portion provided adjacent to the attachment plane portion to be engaged with a tool uneven portion of a tool for vibration transmission to bond the additional metal layer on the circuit pattern with ultrasonic vibration, wherein the attachment plane portion is a face having unevenness smaller than the engagement uneven portion.

A manufacturing method for the circuit board according to the present invention layers the additional metal layer on the circuit pattern, and presses a tool onto a surface of the additional metal layer to apply ultrasonic vibration, the tool having a retracted portion and a tool uneven portion corresponding to the attachment plane portion and the engagement uneven portion, thereby bonding the additional metal layer on the circuit pattern due to transmission of the ultrasonic vibration while leaving the attachment plane portion on the surface of the additional metal layer in an area according to the retracted portion and forming the engagement uneven portion on the surface of the additional metal layer according to the tool uneven portion.

The circuit board according to the present invention layers and bonds the additional metal layer onto the circuit pattern, so that heat dissipation of an electronic component is improved according to increase of thickness of the metal layer, the electronic component fixed to the attachment plane portion of the additional metal layer using solder.

Bonding of the additional metal layer is surely performed by transmitting the ultrasonic vibration in a planar direction using the tool in a state that the tool uneven portion engages with the engagement uneven portion of the metal layer.

Further, the engagement uneven portion adjacent to the attachment plane portion suppresses outflow of solder when an electronic component is fixed to the attachment plane portion of the additional metal layer.

The manufacturing method of the circuit board according to the present invention allows outflow of solder fixing an electronic component to be suppressed using the engagement uneven portion having been used when performing bonding by ultrasonic vibration while providing the surface of the additional metal layer with the attachment plane portion.

The tool used for the manufacturing method of the circuit board according to the present invention easily realizes the manufacturing method of the circuit board.

BRIEF DESCRIPTION OF THE DRAWINGS

FIG. 11 is a schematic plan view of an additional copper plate before a semiconductor chip is mounted according to an embodiment 2 of the present invention;

FIG. 12A is a partly enlarged plan view of a pat XII of FIG. 11, and FIG. 12B is a partly enlarged sectional view of the pat XII of FIG. 11;

FIGS. 13A and B relate to a modification of the embodiment 2 in which FIG. 13A is a partly enlarged plan view of the part XII of FIG. 11, and FIG. 13B is a partly enlarged sectional view of the part XII of FIG. 11;

FIGS. 14A and B relate to a modification of the embodiment 2 in which FIG. 14A is a partly enlarged plan view of the part XII of FIG. 11, and FIG. 14B is a partly enlarged sectional view of the part XII of FIG. 11;

FIGS. 15A and B relate to a modification of the embodiment 2 in which FIG. 15A is a partly enlarged plan view of the part XII of FIG. 11, and FIG. 15B is a partly enlarged sectional view of the part XII of FIG. 11;

FIG. 16 is a schematic plan view of an additional copper plate before a semiconductor chip is mounted according to an embodiment 3;

In FIGS. 17A and B, FIG. 17A is a partly enlarged plan view of a part XVII of FIG. 16, and FIG. 17B is a partly sectional view of the part XVII of FIG. 16;

FIGS. 18A and B relate to a modification of the embodiment 3 in which FIG. 18A is a partly enlarged plan view of the part XVII of FIG. 16, and FIG. 18B is a partly enlarged sectional view of the part XVII of FIG. 16;

FIGS. 19A and B relate to an embodiment 4 of the present invention in which FIG. 19A is a schematic plan view of an additional copper layer before a semiconductor chip is mounted.

FIGS. 20A and B relate to the embodiment 4 of the present invention in which FIG. 20A is a schematic plan view of an additional copper layer before an attachment plane portion is formed.

FIGS. 21A and B relate to an embodiment 5 of the present invention in which FIG. 21A is a schematic plan view of an additional copper layer before a semiconductor chip is mounted.

EMBODIMENT FOR CARRYING OUT THE INVENTION

Figure 1:
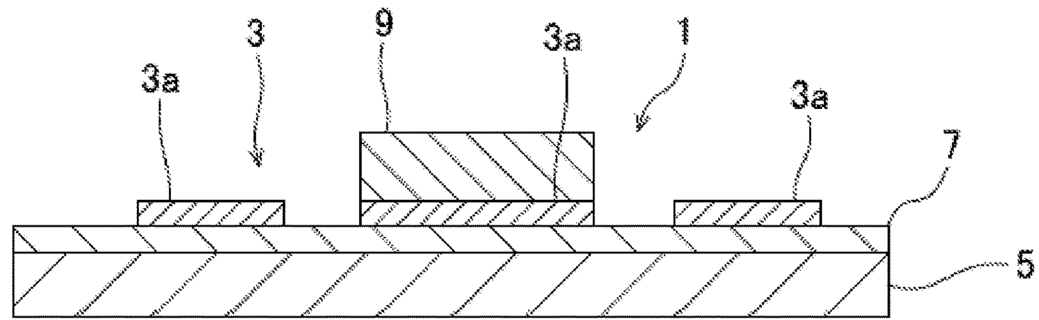
FIG. 1 is a schematic sectional view of a circuit board before a semiconductor chip is mounted according to an embodiment 1 of the present invention.

The present invention accomplishes an object to further improve heat dissipation of a semiconductor chip mounted on an additional metal layer using solder, the additional metal layer bonded to a circuit pattern diverting an ultrasonic bonding technique as follows.

A circuit board of the present invention comprises a circuit pattern (3) on a base plate (5) and an additional metal layer (9) layered and bonded on the circuit pattern (3). The additional metal layer (9) comprises an attachment plane portion (13) configured to fix an electronic component (11) using solder, and an engagement uneven portion (17) provided adjacent to the attachment plane portion (13) to be engaged with a tool uneven portion (15) of a tool (T) for vibration transmission to bond the additional metal layer (9) on the circuit pattern (3) with ultrasonic vibration. The attachment plane portion (13) is a face having unevenness smaller than the engagement uneven portion (17).

Since the attachment plane portion (13) should be the face having unevenness smaller than the engagement uneven portion (17), and the attachment plane portion may be a flat surface or an uneven surface having recesses and projections smaller than the engagement uneven portion.

The engagement uneven portion (17) may be embodied by having engagement projected portions (17*b*) projecting from the attachment plane portion (13). The unevenness of the engagement uneven portion (17) is, however, relative, and the engagement uneven portion may be embodied by having the engagement projected portions (17*b*) having a height flushing with the attachment plane portion (13) or having a lower projection portions (17*b*) than the attachment plane portion (13). The engagement projected portions (17*b*) projecting from the attachment plane portion (13) may be embodied by bulging from the attachment plane portion (13) by plastically deforming the additional metal layer (9). The engagement projected portion (17*b*) may be embodied by having a recess (17*c*) or a flat face (17*d*) on a top. Further, the engagement uneven portion (17) may be embodied by having tilted side faces (17*e*).

The engagement uneven portion (17) is indentation of the tool uneven portion (15). The engagement uneven portion (17) may be formed by pressing of a special tool separated from the tool (T) for transmitting ultrasonic vibration. The engagement uneven portion (17) may be formed on the additional metal layer (9) by cutting, a laser or the like.

Although the engagement uneven portion (17) and the tool uneven portion (15) may correspond one to one in a case that the engagement uneven portion is formed by the pressing of the tool uneven portion (15), the tool uneven portion (15) may be embodied by setting to have less unevenness than the engagement uneven portion (17) in a case that the engagement uneven portion (17) is formed by cutting, a laser or the like.

The engagement uneven portion (17) may be provided on a whole or part of a circumference surrounding the attachment plane portion (13). The engagement uneven portion (17) should be engaged with the tool uneven portion (15) of the tool, transmit the ultrasonic vibration to the additional metal layer (9), and suppress at least part of outflow of solder.

The engagement uneven portion (17) may be embodied by being provided intermittently or successively with engagement recessed portions (17*a*) and engagement projected portions (17*b*). The engagement recessed portions (17*a*) and the engagement projected portions (17*b*) intermittently provided may be embodied by any of that engagement recessed portions (17*a*) and engagement projected portions (17*b*) adjacent to each other are aligned in a circumferential direction and a circumference-intersection direction, that the engagement recessed portions and engagement projected portions adjacent to each other are regularly positionally displaced, or that the engagement recessed portions and the engagement projected portions adjacent to each other are randomly arranged. The successive engagement uneven portion (17) may be embodied by that the engagement recessed portions (17*a*) and the engagement projected portions (17*b*) are successive in the whole of the circumference surrounding the attachment plane portion (13) or that the engagement recessed portions and the engagement projected portions are intermittently successive.

A manufacturing method for manufacturing the circuit board uses the tool (T) having a retracted portion (21) and the tool uneven portion (15) corresponding to the attachment plane portion (13) and the engagement uneven portion (17). Namely, the additional metal layer (9) is layered on the circuit pattern (3), and the tool (T) is pressed onto a surface of the additional metal layer (9) to apply ultrasonic vibration. This bonds the additional metal layer (9) on the circuit pattern (3) due to transmission of the ultrasonic vibration while leaving the attachment plane portion (13) on the surface of the additional metal layer (9) in an area according to the retracted portion (21) and forming the engagement uneven portion (17) on the surface of the additional metal layer (9) according to the tool uneven portion (15).

At the time of the ultrasonic vibration, a friction reducing material (27) may be interposed between the retracted portion (21) and the surface of the additional metal layer (9), to press the retracted portion (21) onto the surface of the additional metal layer (9) through the friction reducing material (27). Further, the retracted portion (21) may have a reduction uneven portion (25) to reduce friction against the surface of the additional metal layer (9), and the reduction uneven portion (25) may be pressed onto the surface of the additional metal layer (9).

In the manufacturing method of the circuit board, pressing load of the tool (T) pressed onto the surface of the additional metal layer (9) may be in a degree to bulge the engagement projected portions (17*b*) of the engagement uneven portion (17) from the attachment plane portion (13) integrally with the additional metal layer (9).

Further, the pressing load of the tool may be in a degree to form the recess (17*c*) or a flat face (17*d*) on the top of the engagement projected portion (17*b*).

The tool (T) used in the manufacturing method of the circuit board is provided with the retracted portion (21) and the tool uneven portion (15) corresponding to the attachment plane portion (13) and the engagement uneven portion (17).

Figure 2:
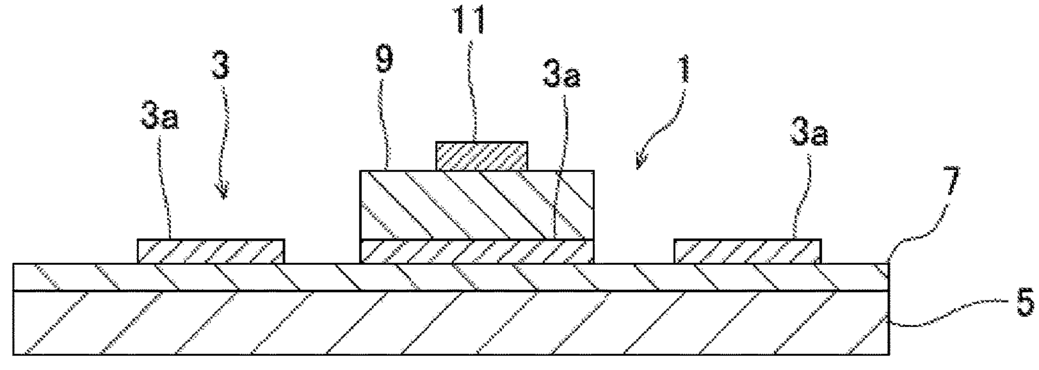
FIG. 2 is a schematic sectional view of the circuit board after the semiconductor chip is mounted according to the embodiment 1.

FIG. 1 is a schematic sectional view of a circuit board before a semiconductor chip is mounted according to the embodiment 1. FIG. 2 is a schematic sectional view of the circuit board after the semiconductor chip is mounted.

A circuit board 1 of FIG. 1 and FIG. 2 is one that a circuit pattern being partially thicken by an additional metal layer as a circuit board 3 adapted to needs for large current.

The circuit board 1 is a metal-based circuit board being provided with the circuit pattern 3 on a metal base plate 5 through an insulating layer 7. The circuit board 1, however, may be a ceramic circuit board in which a circuit pattern 3 is formed on a ceramic base plate or the like. An additional copper plate 9 as an additional metal layer is layered on and bonded to the circuit pattern 3. With this, the circuit pattern 3 is partially thicken and improved in heat dissipation.

The circuit pattern 3 is formed of a circuit copper material, a thickness of which is 0.5 mm for example. The thickness of the circuit pattern 3 is set in view of etching process time and may be a thickness selected other than 0.5 mm. The circuit pattern 3 may be formed of aluminum or the like.

The circuit pattern 3 is formed by etching and is provided with a plurality of circuit conductors 3*a*. A configuration of the plurality of the circuit conductors 3*a* corresponds to required characteristics of the circuit pattern 3. It should be noted that the circuit pattern 3 may be one formed in advance by pressing or cutting and adhered on the metal base plate 5 through the insulating layer 7.

The metal base plate 5 is made of, for example, a single metal or an alloy, a thickness of which is set to, for example, 2.0 mm. The metal base plate 5 may or may not have flexibility. As the material of the metal base plate 5, aluminum, iron, copper, aluminum alloy, or stainless steel may be used. The metal base plate 5 may further include nonmetal such as carbon. For example, the metal base plate 5 may include aluminum composited with carbon. Further, the metal base plate 5 may have a single layer structure or a multi-layer structure.

The metal base plate 5 has high heat conductivity. For example, it has heat conductivity of 370-400 W·m-1·K-1 in copper material, 190-220 W·m-1·K-1 in aluminum material, or 60-80 W·m-1·K-1 in iron material.

In addition, a metal base plate having a heat sink shape may be used for the circuit board 1.

The insulating layer 7 functions to electrically insulate the circuit pattern 3 from the metal base plate 5 and additionally functions as an adhesive to bond them together. Accordingly, resin is generally used for the insulating layer 7, a thickness of which is set to 0.13 mm for example.

Further, since the insulating layer 7 requires high heat resistance against high heat generation of elements mounted on the circuit pattern 3 and high heat conductivity to transmit the heat to the metal base plate 5, the insulating layer 7 preferably additionally includes inorganic fillers.

The insulating layer 7 may be formed of epoxy resin, cyanate resin or the like. To the epoxy resin, for example, an amin-based curing agent, a phenol-based curing agent, an acid anhydride-based curing agent, or an imidazole-based curing agent is combined. To the cyanate resin, for example, dicyandiamide or phenol resin is combined as a curing agent. Further, the insulating layer 7 may be formed of liquid crystal polymer such as fully aromatic polyester being thermoplastic resin or the other thermoplastic resin.

The inorganic fillers included in the insulating layer 7 have preferably superior electric insulation and high heat conductivity, there are, for example, alumina, silica, aluminum nitride, boron nitride, silicon nitride, magnesium oxide and the like, and one or two or more kinds selected from among them may be used.

A filling rate of the inorganic fillers in the insulating layer 7 may be appropriately set according to a kind of the inorganic fillers. For example, it is preferably 85 vol % or less, more preferably 30-85 vol %, on the basis of a whole volume of the resin included in the insulating layer 7.

The insulating layer 7 may further include a coupling agent, a dispersing agent or the like, for example.

Figure 3:
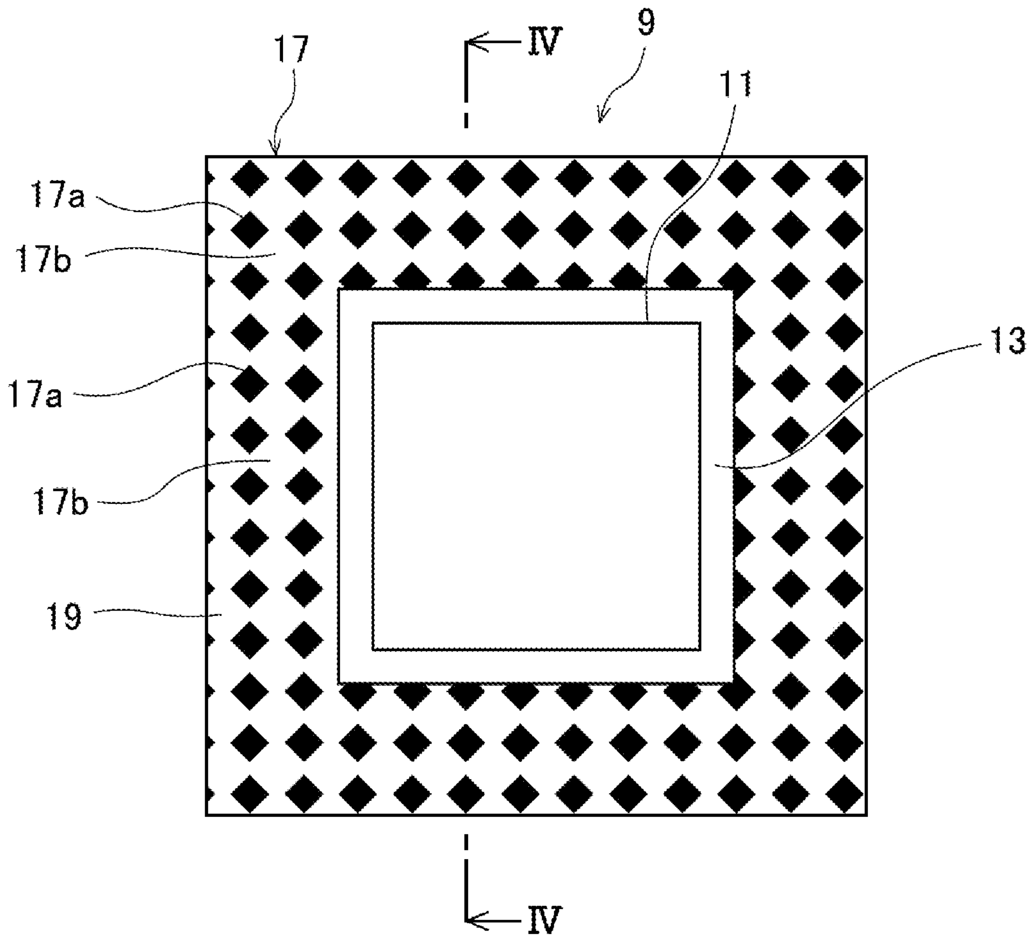
FIG. 3 is a schematic enlarged plan view of an additional copper plate after the semiconductor chip is mounted according to the embodiment 1.
Figure 4:
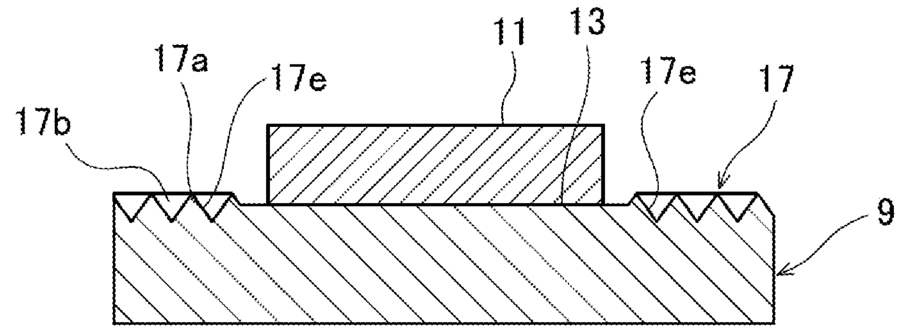
FIG. 4 is a schematic enlarged sectional view taken along a line IV-IV of FIG. 3.
Figure 5A:
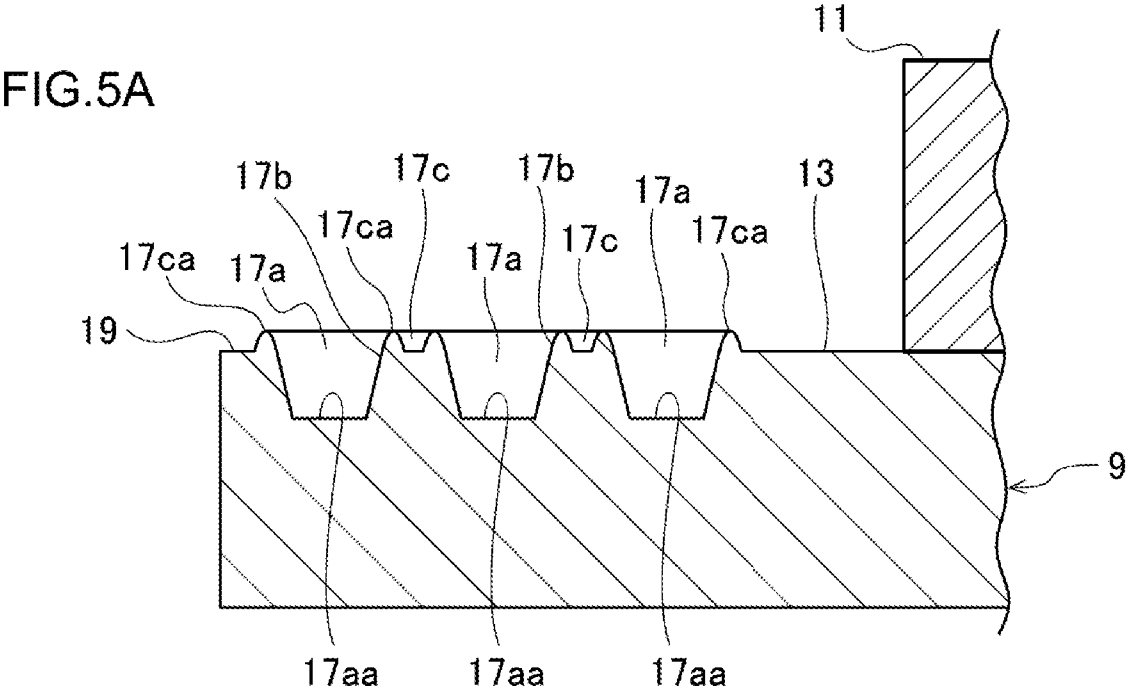
FIG. 5A is a partly enlarged schematic sectional view of an additional copper plate according to a modification of the embodiment 1.
Figure 5B:
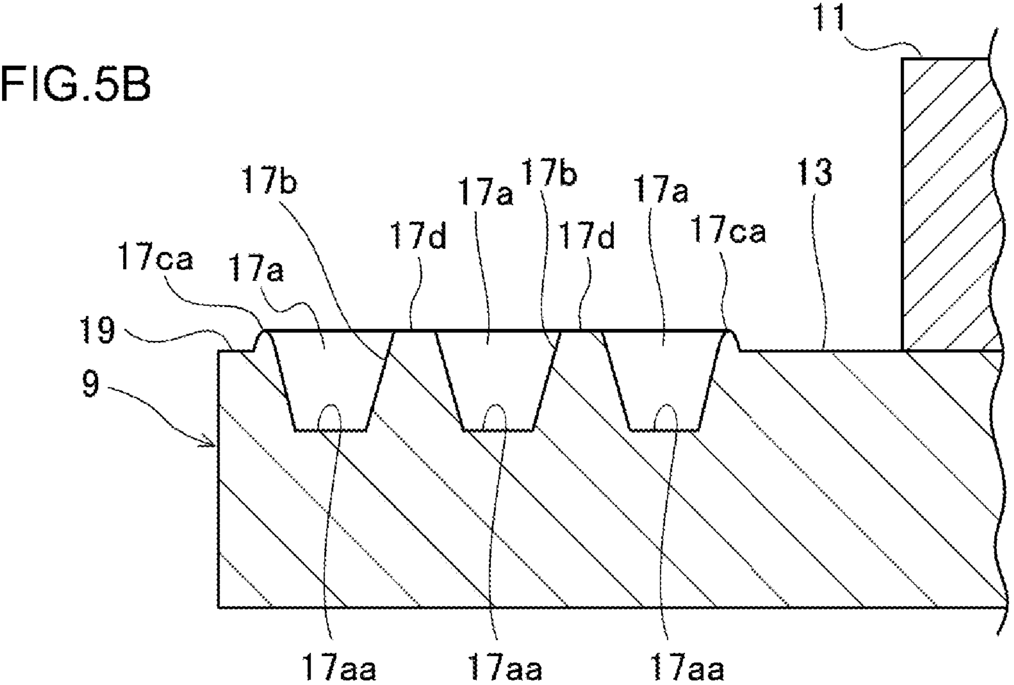
FIG. 5B is a partly enlarged schematic sectional view of an additional copper plate according to an another modification of the embodiment 1.

In addition, a semi-cured insulating sheet may be used as the insulating layer 7. FIG. 3 is a schematic enlarged plan view of an additional metal layer after the semiconductor chip is mounted. FIG. 4 is a schematic enlarged sectional view of the additional metal layer after the semiconductor chip is mounted taken along a line IV-IV of FIG. 3. FIGS. 5A and 5B relate to modifications, in which FIG. 5A is a partly enlarged schematic sectional view of a state that a semiconductor chip is mounted on an additional copper plate having a recess at a top of an engagement projected portion, and FIG. 5B is a partly enlarged schematic sectional view of a state that a semiconductor chip is mounted on an additional copper plate having a flat face on a top of an engagement projected portion.

As illustrated in FIGS. 1-4, the additional copper plate 9 as the additional metal layer is formed of copper plate material, and is provided with an attachment plane portion 13 and an engagement uneven portion 17. It should be noted that the additional metal layer may employ appropriate material according to the circuit pattern 3, and may be formed of an additional aluminum plate using aluminum plate material or the like, for example.

The additional copper plate 9 is bonded to a selected circuit conductor 3*a* of the circuit pattern 3. The additional copper plate 9 is, for example, 10 mm square and 1.0 mm thick. It should be noted that the additional copper plate 9 is to increase the thickness of the circuit conductor 3*a*, dimensions of which correspond to of the target circuit conductor 3*a* or semiconductor chip 11.

The attachment plane portion 13 is to mount the semiconductor chip 11 as an electronic component using solder thereon. The attachment plane portion 13 is a face having unevenness smaller than the engagement uneven portion 17, and is wholly a flat face according to the present embodiment. The attachment plane portion 13 may be, however, realized by that even recessed portions and the like are partially or wholly existed.

A planer shape of the attachment plane portion 13 is formed similarly to an outer contour shape of the semiconductor chip 11 to be mounted in a plan view. The attachment plane portion 13 is set into a substantial square shape larger than the semiconductor chip 11 having a square shape in the plan view.

The attachment plane portion 13 may be, however, different from the outer contour shape of the semiconductor chip 11 in the plan view. For example, the attachment plane portion 13 may be a circular shape or the like in the plan view. Further, the planar shape of the attachment plane portion 13 may be smaller than of the semiconductor chip 11 or be equivalent to of the semiconductor chip 11.

The engagement uneven portion 17 is provided adjacent to the attachment plane portion 13 to be engaged with a tool uneven portion 15 (explained later with FIG. 7) of a tool T (explained later with FIG. 7) for vibration transmission to bond the additional copper plate 9 on the circuit pattern 3 with ultrasonic vibration in a planar direction. The engagement uneven portion 17 has been used as one to engage the tool uneven portion 15 therewith in a state that the additional copper plate 9 is bonded on the circuit pattern 3. Further, the engagement uneven portion 17 is provided to suppress outflow of solder outside the additional copper plate 9.

It should be noted that adjacency of the engagement uneven portion 17 to the attachment plane portion 13 may be any of a position contacting an outer edge of the attachment plane portion 13 or an outer position distanced from the outer edge of the attachment plane portion 13.

The engagement uneven portion 17 is provided with engagement recessed portions 17*a* and engagement projected portions 17*b*. The engagement recessed portions 17*a* and the engagement projected portions 17*b* are provided intermittently on a whole of a circumference surrounding the attachment plane portion 13.

The intermittence of the engagement recessed portions 17*a* and the engagement projected portions 17*b* on the whole of the circumference of the attachment plane portion 13 means that the engagement recessed portions 17*a* and the engagement projected portions 17*b* are regularly arranged at uniform intervals along each side of the square attachment plane portion 13. Distances between the engagement recessed portions 17*a* and the engagement projected portions 17*b* may be set randomly.

The engagement recessed portions 17*a* and the engagement projected portions 17*b* are aligned and formed in two or three lines between each side of an outer edge of the square shape of the additional copper plate 9 and the attachment plane portion 13. The number of the lines is not particularly limited and may be increased or reduced. The number of the lines on each side of the square shape may be different.

The engagement recessed portions 17*a* and the engagement projected portions 17*b* may be provided on part of the circumference surrounding the attachment plane portion 13.

As illustrated in FIG. 3 and FIG. 4, the engagement recessed portion 17*a* of the engagement uneven portion 17 is formed into a square shape in the plan view, and into an inverted square pyramid shape in the sectional view. As this result, the engagement uneven portion 17 has tilted side faces 17*e*. The tilting in this context means tilting relative to a thickness direction of the additional copper plate 9.

As illustrated in FIG. 4, a bottom of the engagement recessed portion 17*a* of the engagement uneven portion 17 is lower than the attachment plane portion 13. The engagement uneven portion 17 should be one to engage the tool uneven portion 15 (explained later in FIG. 7) therewith and suppress outflow of solder, and the shape of the engagement recessed portion 17*a* is not particularly limited, and may be a recessed portion formed by a curved surface or the like.

The engagement projected portions 17*b* of the engagement uneven portion 17 is set so as to protrude from the attachment plane portion 13. The engagement uneven portion 17 including the engagement recessed portions 17*a* and the engagement projected portions 17*b* is indentation of the tool uneven portion 15 to be explained later, and the engagement projected portions 17*b* are formed to be bulged from the attachment plane portion 13 by plastically deforming of the additional copper plate 9.

The engagement projected portion 17*b* may be provided with a recess 17*c* on a top as the modification of FIG. 5A or may be provided with a flat face 17*d* on a top as the other modification of FIG. 5B.

The recess 17*c* of FIG. 5A is formed by a bulged portion 17*ca* on a periphery of an opening of the engagement recessed portion 17*a*. The bulged portion 17*ca* of the engagement recessed portion 17*a* nearest to the attachment plane portion 13 is adjacent to the attachment plane portion 13 in the plan view. On the outer periphery of the additional copper plate 9, the bulged portion 17*ca* is adjacent to a flat plane portion 19 on the outer periphery. In addition, the engagement uneven portion 17 may be formed up to the outer periphery of the additional copper plate 9, and the flat plane portion 19 on the outer periphery may not be provided. The flat plane portion 19 is a common surface of the additional copper plate 9 before the engagement uneven portion 17 is formed and is the same level as the attachment plane portion 13.

As the other modification of FIG. 5B, in a case that the engagement projected portion 17*b* has the flat face 17*d* on its top, the bulged portion 17*ca* is adjacent to the attachment plane portion 13 and the outer periphery of the flat plane portion 19 similar to the additional copper plate 9 of the modification of FIG. 5A.

The semiconductor chip 11 is fixed to the attachment plane portion 13 with solder. The semiconductor chip 11 is connected to the other circuit conductors 3*a* through aluminum wires or the like not illustrated.

As mentioned above, the circuit board 1 has the circuit pattern 3 being partially thicken by ultrasonic-bonding the additional copper plate 9 on the circuit conductor 3*a.*

This further improves heat dissipation of the semiconductor chip 11 mounted on the attachment plane portion 13 of the additional copper plate 9 with the solder according to the increase of the thickness by means of the additional copper plate 9.

In the additional copper plate 9, the central attachment plane portion 13 is the flat face. Accordingly, on the attachment plane portion 13 for the semiconductor chip 11, the solder is suppressed from being unnecessarily remained between the semiconductor chip 11 and the attachment plane portion 13 at the time of the mounting of the semiconductor chip 11. This suppresses reduction of the heat dissipation of the circuit board 1.

When the solder to fix the semiconductor chip 11 to the attachment plane portion 13 flows out from the attachment plane portion 13 toward the circumference at the time of the mounting of the semiconductor chip 11, the engagement uneven portion 17 suppresses outflow of the solder. Namely, the outflow of the solder outside the additional copper plate 9 is suppressed.

Further, the attachment plane portion 13 is surrounded by the engagement uneven portion 17, thereby mounting the semiconductor chip 11 while the attachment plane portion 13 is easily recognized.

The engagement uneven portion 17 provided on the additional copper plate 9 has the bulged portion 17*ca* protruding from the attachment plane portion 13 as a mountain against the attachment plane portion 13 as a reference face.

This further improves the function of the used engagement uneven portion 17 to suppress outflow of the solder outside the additional copper plate 9.

Figure 6A:
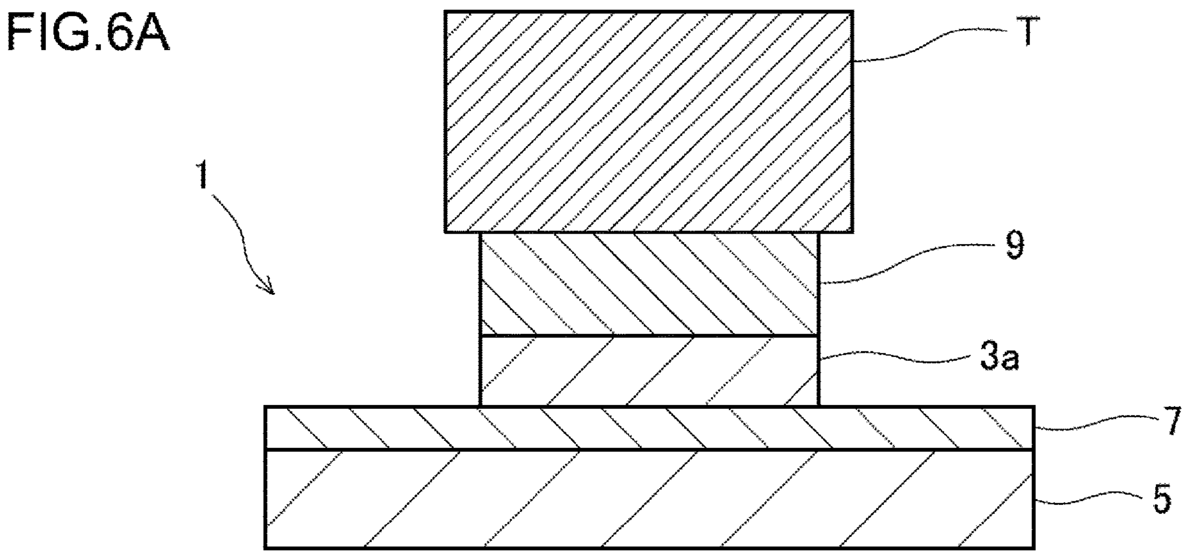
FIGS. 6A and 6B are schematic sectional views of a situation that the additional copper plate is ultrasonic-bonded to a circuit pattern.
Figure 6B:
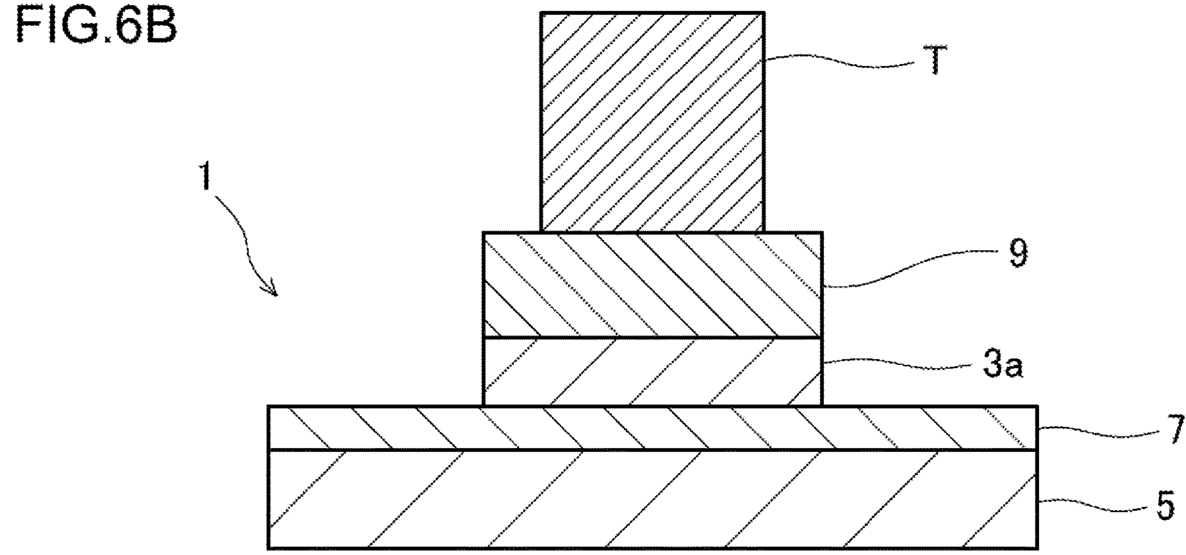
Figure 7:
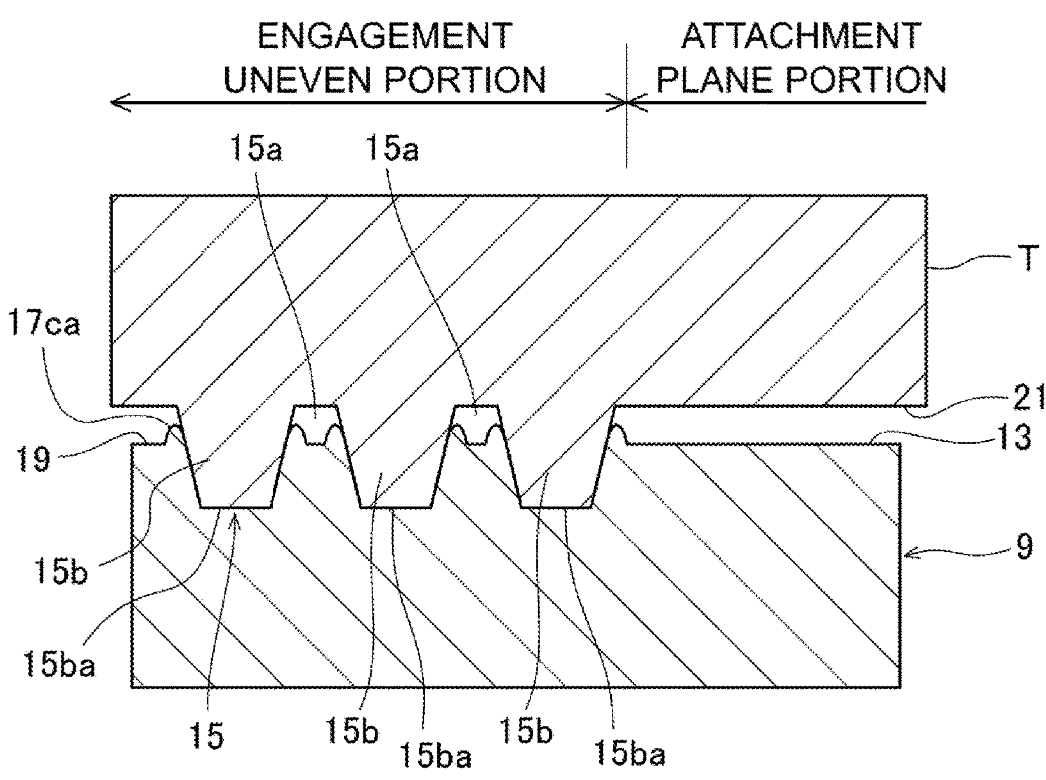
FIG. 7 is a partly enlarged sectional view of a state that a tool is pressed onto the additional copper plate according to the modification of the embodiment 1.
Figure 8:
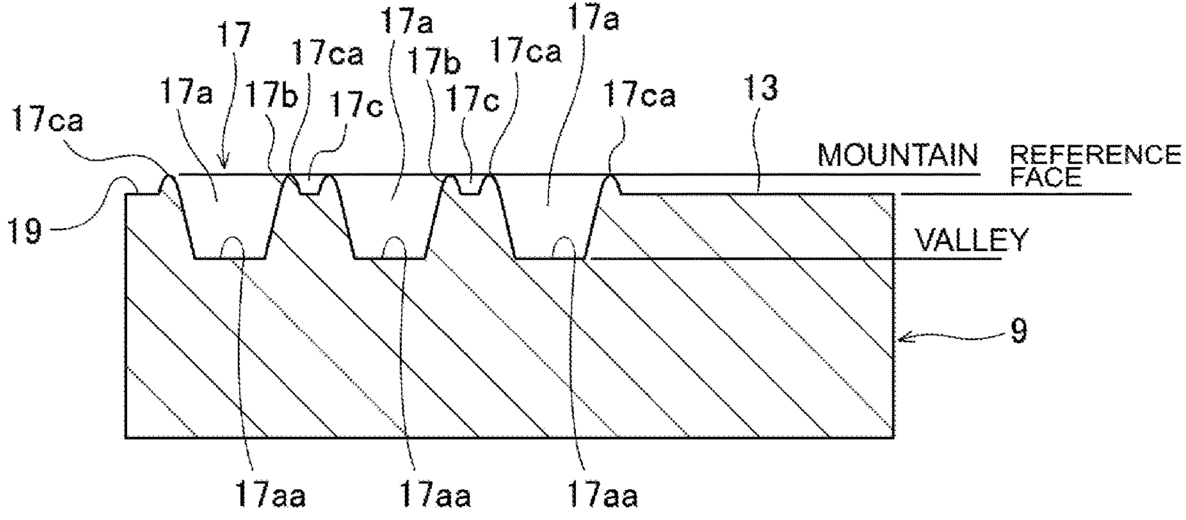
FIG. 8 is a partly enlarged sectional view illustrating the attachment plane portion and the engagement uneven portion of the additional copper plate according to the modification of the embodiment 1.
Figure 9:
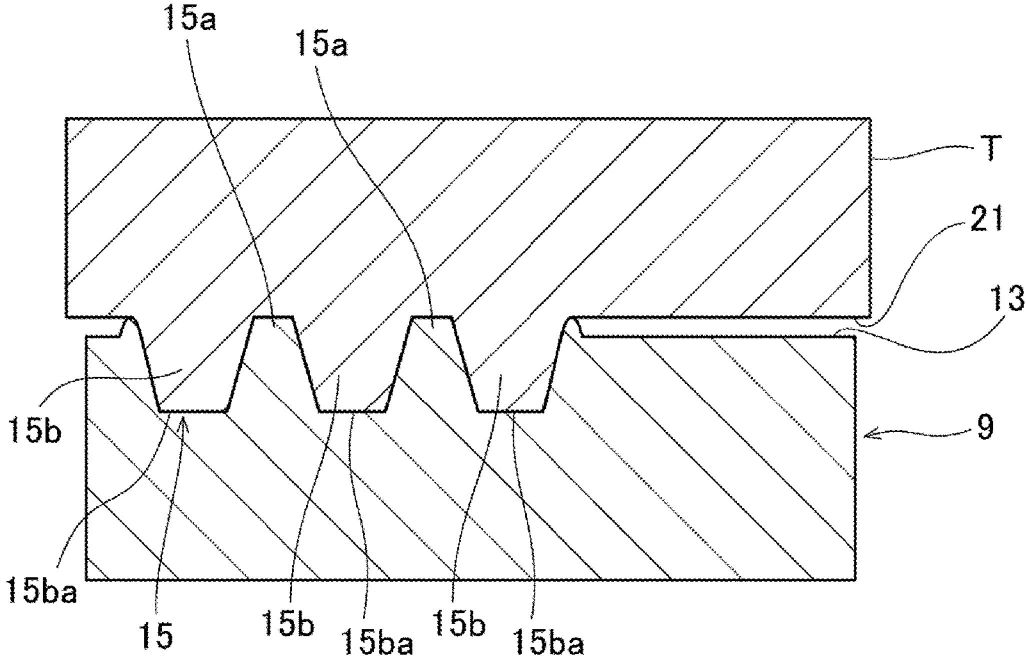
FIG. 9 is a partly enlarged sectional view of a state that a tool is pressed onto the additional copper plate according to the other modification of the embodiment 1.
Figure 10:
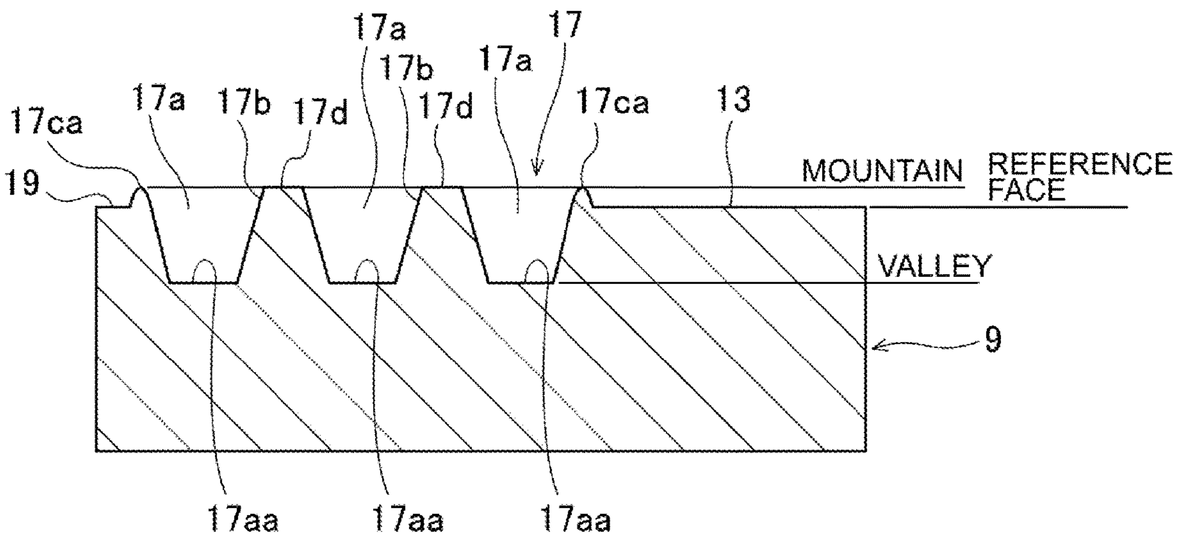
FIG. 10 is a partly enlarged sectional view illustrating the attachment plane portion and the engagement uneven portion of the additional copper plate according to the other modification of the embodiment 1.

FIGS. 6A and 6B are schematic sectional views of a situation of ultrasonic-bonding to the circuit pattern according to the embodiment 1. FIG. 7 is a partly enlarged sectional view of a state that the tool is pressed onto the additional copper plate according to the modification of the embodiment 1. FIG. 8 is a partly enlarged sectional view illustrating the attachment plane portion and the engagement uneven portion of the additional copper plate according to the modification of the embodiment 1. FIG. 9 is a partly enlarged sectional view of a state that the tool is pressed onto the additional copper plate in the other modification of the embodiment 1. FIG. 10 is a partly enlarged sectional view illustrating the attachment plane portion and the engagement uneven portion of the additional copper plate according to the other modification of the embodiment 1.

Although the manufacturing method of the circuit board according to the embodiment of the present invention will be explained representatively for the modification of FIGS. 7 and 8, and the other modification of FIGS. 9 and 10, the manufacturing method is common even in the example of FIGS. 3 and 4.

As illustrated in FIG. 6, the manufacturing method uses the tool T. In addition, FIG. 6A is an example using the tool T being 12 mm square larger than the additional copper plate 9 being 10 mm square. FIG. 6B is an example using the tool T being 5.8 mm square smaller than the additional copper plate 9 being 10 mm square for example.

The tool T is provided with a retracted portion 21 and the tool uneven portion 15 corresponding to the attachment plane portion 13 and the engagement uneven portion 17 in the sectional view of FIG. 7.

The tool T corresponds to the planar shape and the sectional shape of the additional copper plate 9 of FIG. 3 and FIG. 5A, the retracted portion 21 of which is formed in a center of a bottom face being a flat surface and the tool uneven portion 15 of which is formed around the retracted portion.

The retracted portion 21 is a flat face and forms a distance with respect to the attachment plane portion 13 when pressing the tool T onto the additional copper plate 9. The retracted portion 21 may, however, contact the attachment plane portion 13. The retracted portion 21 should be retracted relatively to the tool uneven portion 15. The retracting means a degree that the attachment plane portion 13 being the face having the unevenness smaller than the engagement uneven portion 17 is left according to the presence of the retracted portion 21 in a state that the tool T is completely pressed onto the surface of the additional copper plate 9. Namely, the retracting includes the retracted portion 21 contacting the attachment plane portion 13 or forming a distance to the attachment plane portion in a state that the retracted portion 21 presses the additional copper plate 9 to form the attachment plane portion 13 and completes the pressing in process that the tool T is pressed onto the surface of the additional copper plate 9. A surface shape of the retracted portion 21 such as a curved face or uneven face other than the flat face is freely selected as long as the attachment plane portion 13 is ensured.

The tool uneven portion 15 is provided intermittently with tool recessed portions 15*a* and tool projected portions 15*b* on a whole of a circumference surrounding the retracted portion 21, the tool recessed portions and the tool projected portions corresponding to the engagement projected portions 17*b* and the engagement recessed portions 17*a* of the engagement uneven portion 17 to form them. The tool recessed portions 15*a* and the tool projected portions 15*b* are formed into relatively reversed trapezoidal shapes in the sectional view. A tip end 15*ba* of the tool projected portion 15*b* is a flat face according to a bottom portion 17*aa* of the engagement recessed portion 17.

The manufacturing method of the present embodiment using the tool T layers the additional copper plate 9 on the circuit pattern 3 and presses the tool T on the surface of the additional copper plate 9 to apply ultrasonic vibration. This bonds the additional copper plate 9 on the circuit conductor 3*a* of the circuit pattern 3 according to transmission of the ultrasonic vibration while leaving the attachment plane portion 13 on the surface of the additional copper plate 9 in an area corresponding to the retracted portion 21 and forming the engagement uneven portion 17 on the surface of the additional copper plate 9 according to the tool uneven portion 15.

In particular, first, the metal base plate 5 is fixedly supported using a jig or the like in advance, and the additional copper plate 9 to be layered is positioned and arranged on any one of the circuit conductors 3*a* of the circuit pattern 3.

Next, the tool T is pressed onto the surface of the additional copper plate 9 to apply pressure and transmit the ultrasonic vibration in a planar direction of the circuit conductor 3*a*.

With the ultrasonic vibration, a plastic flow is caused in bonding surfaces and the additional copper plate 9 is bonded and connected on the circuit conductor 3*a*.

At this time, the attachment plane portion 13 is left on the surface of the additional copper plate 9 according to the retracted portion 21 and the engagement uneven portion 17 is formed on the surface of the additional copper plate 9 according to the tool uneven portion 15 based on the pressing of the tool T against the surface of the additional copper plate 9.

Pressing load of the tool T onto the additional copper plate 9 is in a degree to integrally bulge the engagement projected portions 17*b* of the engagement uneven portion 17 from the attachment plane portion 13. At this time, the retracted portion 21 may form a distance relative to the attachment plane portion 13 as illustrated in FIG. 7 or the retracted portion 21 may contact the attachment plane portion 13.

According to the degree of the pressing caused by the pressing load of FIG. 7, the bulged portion 17*ca* is formed on the periphery of the opening of the engagement recessed portion 17*a* as the mountain against the attachment plane portion 13 as the reference face and the recess 17*c* is left on the top of the engagement projected portion 17*b* as illustrated in FIG. 8. The engagement recessed portion 17*a* is formed as a valley against the attachment plane portion 13 as the reference face, the bottom portion 17*aa* of which is formed flat.

In the other modification of FIG. 9, the pressing load of the tool T is greater than of the case of FIG. 7. According to the degree of the pressing caused by the pressing load of FIG. 9, the bulged portion 17*ca* contacts a flat face in the tool recessed portion 15 as the bottom face of the tool T and the top of the engagement projected portion 17*b* is formed into the flat face 17*d*.

As mentioned above, the manufacturing method of the embodiment 1 transmits the ultrasonic vibration to the additional copper plate 9 in the planar direction while forming the engagement uneven portion 17 using the tool T, to bond the additional copper plate 9 on any of the conductors 3*a* of the circuit pattern 3.

The tool T is, therefore, pressed onto the surface of the additional copper plate 9 and the attachment plane portion 13 is left on the surface of the additional copper plate 9 in the area corresponding to the retracted portion 21. The ultrasonic vibration is transmitted to the additional copper plate 9 using the tool T while the engagement uneven portion 17 is formed on the surface of the additional copper plate 9 according to the tool uneven portion 15 of the tool T, and the additional copper plate 9 is bonded on the circuit conductor 3*a*.

Since the tool T firmly bites into the surface of the additional copper plate 9 at the tool uneven portion 15 on the outer periphery of the retracted portion 21, good bonding is attained between the additional copper plate 9 and the circuit conductor 3*a* at the time of the ultrasonic-bonding.

The circuit board 1 manufactured by the manufacturing method is provided with the used engagement uneven portion 17 used at the time of the transmission of the ultrasonic vibration, to suppress the outflow of the solder.

Accordingly, the attachment plane portion 13 of the additional copper plate 9 is formed into the flat surface not to unnecessarily keep a remnant of the solder, the attachment plane portion on which the semiconductor chip 11 is mounted. The structure to suppress the outflow of the solder outside the additional copper plate 9 by the used engagement uneven portion 17 is easily attained as well as the flat attachment plane portion 13.

The used engagement uneven portion 17 left on the additional copper plate 9 by the indentation according to the tool uneven portion 15 is generated by plastically deforming of the surface of the additional copper plate 9. With the plastic deformation, the bulged portion 17*ca* is caused on the periphery of the opening of the engagement recessed portion 17*a*. The bulged portion 17*ca* is protruded from the attachment plane portion 13 as the mountain against the attachment plane portion 13 as the reference face.

The additional copper plate 9 is ultrasonic-bonded to the circuit conductor 3*a* and it, therefore, shortens the processing time in comparison with a case that an entirely thick circuit pattern 3 is subjected to etching process.

The additional copper plate 9 generates heat on an interface with respect to the circuit conductor 3*a* based on friction according to the ultrasonic bonding. The heat generation is, however, local and instantaneous, and generates no residual stress or suppresses residual stress in comparison with at least the cold spray method. Accordingly, no curve of the circuit board is generated or a curve of the circuit board is suppressed in comparison with at least the cold spray method.

Since the bulk additional copper plate 9 is used, the manufacturing is performed at low cost in comparison with the cold spray method using powder.

FIG. 11 is a schematic plan view of an additional copper plate before a semiconductor chip is mounted according to the embodiment 2 of the present invention. FIG. 12A is a partly enlarged plan view of the additional copper plate in a pat XII of FIG. 11, and FIG. 12B is a partly enlarged sectional view of the additional copper plate in the pat XII of FIG. 11. FIGS. 13A and B relate to a modification of the embodiment 2 in which FIG. 13A is a partly enlarged plan view of an additional copper plate in the part XII of FIG. 11, and FIG. 13B is a partly enlarged sectional view of the additional copper plate in the part XII of FIG. 11. FIGS. 14A and B relate to another modification of the embodiment 2 in which FIG. 14A is a partly enlarged plan view of an additional copper plate in the part XII of FIG. 11, and FIG. 14B is a partly enlarged sectional view of the additional copper plate in the part XII of FIG. 11. FIGS. 15A and B relate to still another modification of the embodiment 2 in which FIG. 15A is a partly enlarged plan view of an additional copper plate in the part XII of FIG. 11, and FIG. 15B is a partly enlarged sectional view of the additional copper plate in the part XII of FIG. 11.

As illustrated in FIG. 11, in an additional copper plate 9 of the embodiment 2, engagement recessed portions 17*a* and engagement projected portions 17*b* of an engagement uneven portion 17 adjacent to each other and intermittently provided are positionally displaced and arranged. The engagement recessed portions 17a and the engagement projected portions 17b are arranged at approximate regular pitches.

The engagement recessed portions 17a and the engagement projected portions 17b are positionally displaced to be arranged, and outflow of solder is more surely suppressed.

An individual shape of the engagement uneven portion 17 of the embodiment 2 is as illustrated in FIGS. 12-15.

The engagement recessed portion 17a of the engagement uneven portion 17 of FIG. 12 is formed into a square shape in the plan view of FIG. 12A and into an inverted trapezoidal shape in the sectional view of FIG. 12B. A bottom portion 17aa of the engagement recessed portion 17a is formed flat and a top of the engagement projected portion 17b is a flat face 17d. A recess 17c may be formed on the top of the engagement projected portion 17b similarly to the embodiment 1.

The engagement recessed portion 17a of the engagement uneven portion 17 of FIG. 13 is formed into a square shape in the plan view of FIG. 13A and into an inverted square pyramid shape in the sectional view of FIG. 13B. The top of the engagement projected portion 17b is the same as of the case of FIG. 12.

The engagement recessed portion 17a of the engagement uneven portion 17 of FIG. 14 is formed into a circular shape in the plan view of FIG. 14A and into an inverted cone shape in the sectional view of FIG. 14B. The top of the engagement projected portion 17b is the same as of the case of FIG. 12.

The engagement recessed portion 17a of the engagement uneven portion 17 of FIG. 15 is formed into a circular shape in the plan view of FIG. 15A and into a curved cone shape in the sectional view of FIG. 15B. The top of the engagement projected portion 17b is the same as of the case of FIG. 12.

A tool T is configured so that a tool uneven portion 15 corresponds to the engagement uneven portion 17 of the additional copper plate 9.

Even the embodiment 2 provides the same effect as the embodiment 1.

In addition, the shapes of the engagement uneven portions 17 of FIG. 12-FIG. 15 may be applied to the embodiment 1.

FIG. 16-FIG. 18 relate to the embodiment 3. FIG. 16 is a schematic plan view of an additional copper plate before a semiconductor chip is mounted. FIG. 17A is a partly enlarged plan view of the additional copper plate in a part XVII of FIG. 16, and FIG. 17B is a partly sectional view of the additional copper plate in the part XVII of FIG. 16. FIGS. 18A and B relate to a modification of the embodiment 3 in which FIG. 18A is a partly enlarged plan view of an additional copper plate in the part XVII of FIG. 16, and FIG. 18B is a partly enlarged sectional view of the additional copper plate in the part XVII of FIG. 16.

As illustrated in FIG. 16, an additional copper plate 9 of the embodiment 3 is provided successively with engagement recessed portions 17a and engagement projected portions 17b of an engagement uneven portion 17. The present embodiment is provided with three engagement recessed portions 17a with similar square frame shapes so as to surround a whole of a circumference of an attachment plane portion 13, and interspaces between the engagement recessed portions 17a are the engagement projected portions 17b. Although a top of the engagement projected portion 17b of the embodiment 3 is formed flat, a recess may be formed thereon similarly to the embodiment 1.

An individual shape of the engagement uneven portion 17 of the embodiment 3 is as illustrated in FIG. 17 and FIG. 18.

The engagement recessed portion 17a of the engagement uneven portion 17 of FIG. 17 is formed to have a substantially uniform width in the plan view of FIG. 17A and formed into an inverted trapezoidal shape in the sectional view of FIG. 17B. A bottom portion 17aa of the engagement recessed portion 17a is formed flat and the top of the engagement projected portion 17b is a flat face 17d. A recess 17c may be formed on the top of the engagement projected portion 17b similarly to the embodiment 1.

The engagement recessed portion 17a of the engagement uneven portion 17 of FIG. 18 is formed to have a substantially uniform width in the plan view of FIG. 18A and formed into an inverted triangle shape in the sectional view of FIG. 18B. The top of the engagement projected portion 17b is the same as of the case of FIG. 17.

Even the embodiment 3 provides the same effect as the embodiment 1.

Figure 19A:
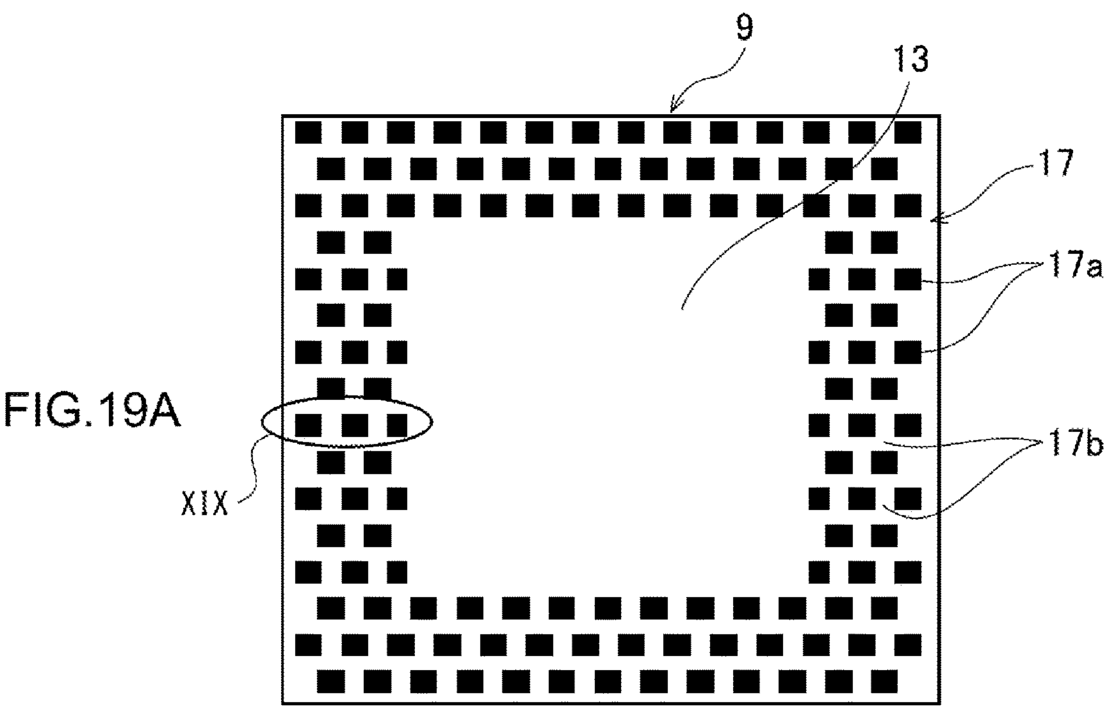
Figure 19B:
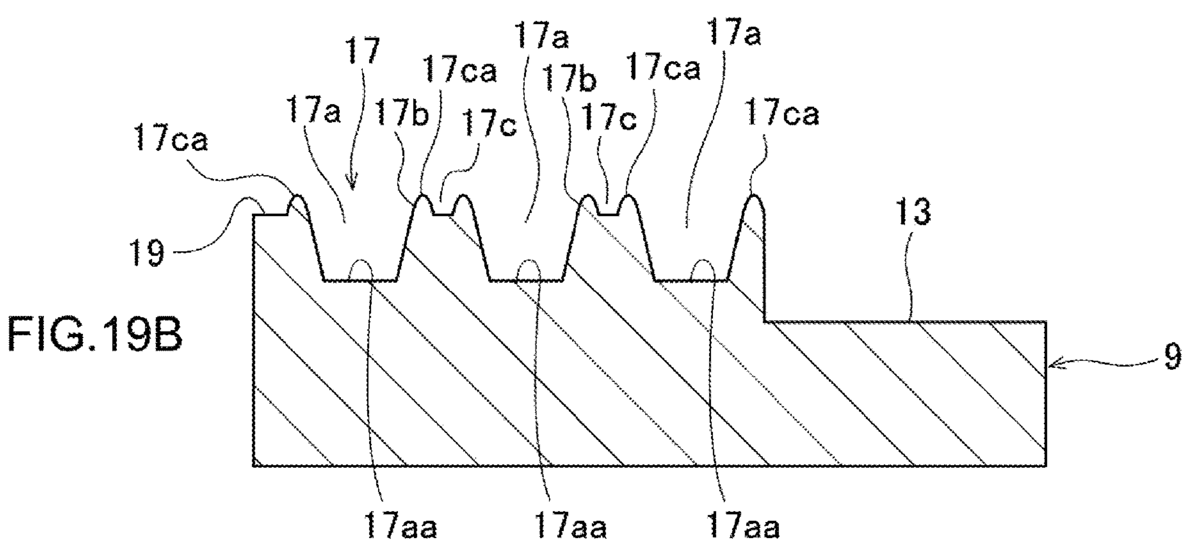
FIG. 19B is a sectional view of a part XIX of FIG. 19A.
Figure 20A:
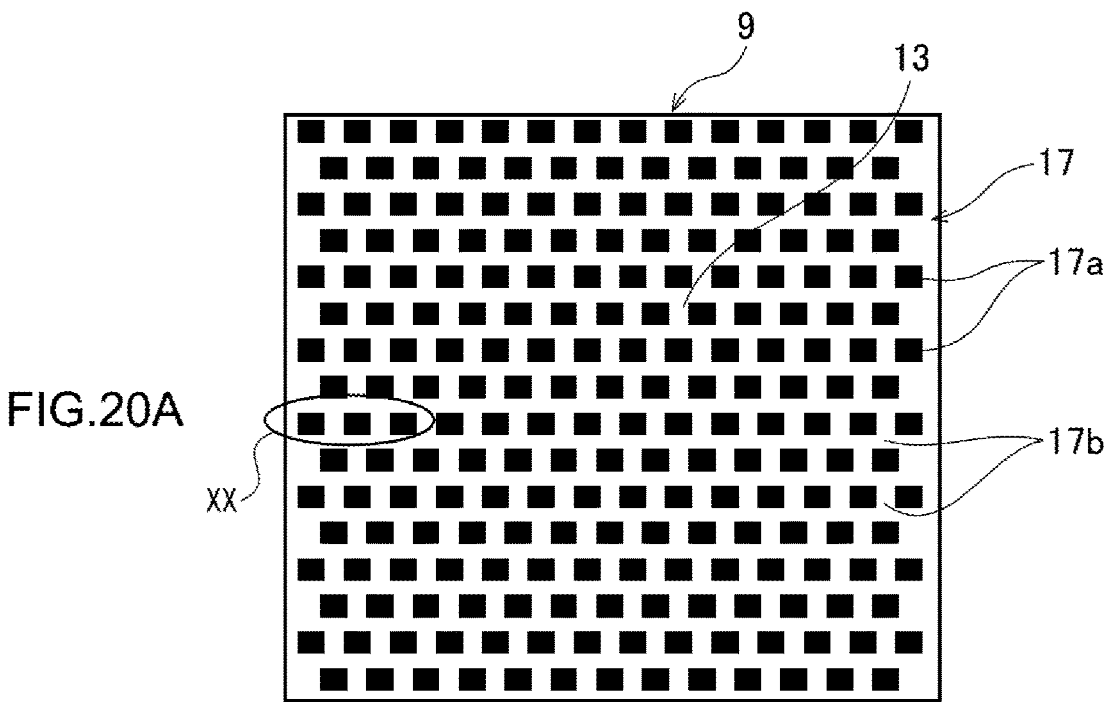
Figure 20B:
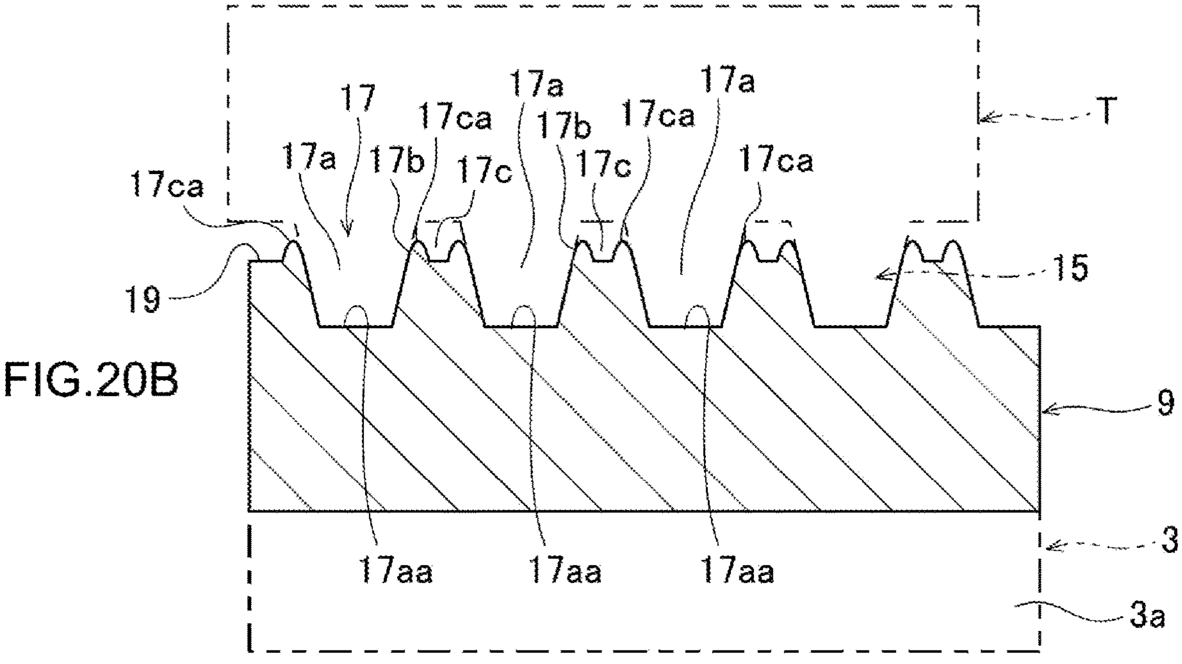
FIG. 20B is a sectional view of a part XX of FIG. 20A.

FIGS. 19A and B relate to the embodiment 4 of the present invention in which FIG. 19A is a schematic plan view of an additional copper layer before a semiconductor chip is mounted, and FIG. 19B is a sectional view of a part XIX of FIG. 19A. In FIGS. 20A and B, FIG. 20A is a schematic plan view of an additional copper layer before an attachment plane portion is formed, and FIG. 20B is a sectional view of a part XX of FIG. 20A. It should be noted that the embodiment 4 has a basic structure in common with the embodiment 1 and corresponding components are represented with the same reference numerals to eliminate repetition in description.

The present embodiment forms an attachment plane portion 13 on a surface of an additional copper plate 9 by cutting as illustrated in FIG. 19A-FIG. 20B.

Namely, the present embodiment presses a tool T so as to bring a tool uneven portions into contact with a whole surface of the additional copper plate 9 to apply ultrasonic vibration as illustrated in FIGS. 20A and 20B, the tool having the tool uneven portion 15 formed on a whole surface or on a whole region to be brought into contact with the surface of the additional copper plate 9.

With this, the additional copper plate 9 is bonded on the circuit conductor 3a of the circuit pattern 3 with the transmission of the ultrasonic vibration while the surface of the additional copper plate 9 is pressed in the whole area and the engagement uneven portion 17 is formed. This surely bonds the additional copper plate 9 on the circuit conductor 3a while further reducing damage of the insulating layer 7.

Next, the attachment plane portion 13 is formed by cutting as illustrated in FIGS. 19A and B. In the present embodiment, the attachment plane portion 13 has a planar shape and a sectional shape similar to the embodiment 1, and the attachment plane portion is arranged lower than a bottom portion of the engagement recessed portion 17a of the engagement uneven portion 17.

In addition, the attachment plane portion 13 is cut into a flat face in the present embodiment. The attachment plane portion 13 should be, however, a face having unevenness smaller than the engagement uneven portion 17 and accordingly the engagement uneven portion 17 may be slightly remained. For example, truncated and lowered engagement projected portions 17b may be remained on the attachment plane portion 13.

In addition, even the embodiment 4 provides the same effect as the embodiment 1.

Figure 21A:
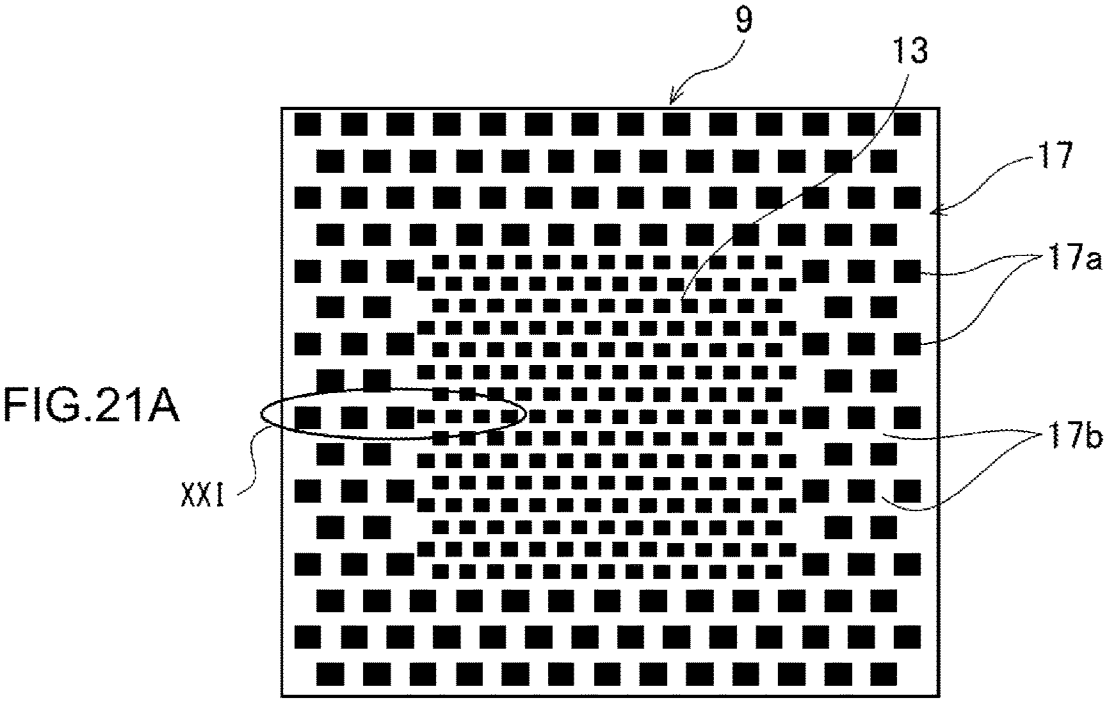
Figure 21B:
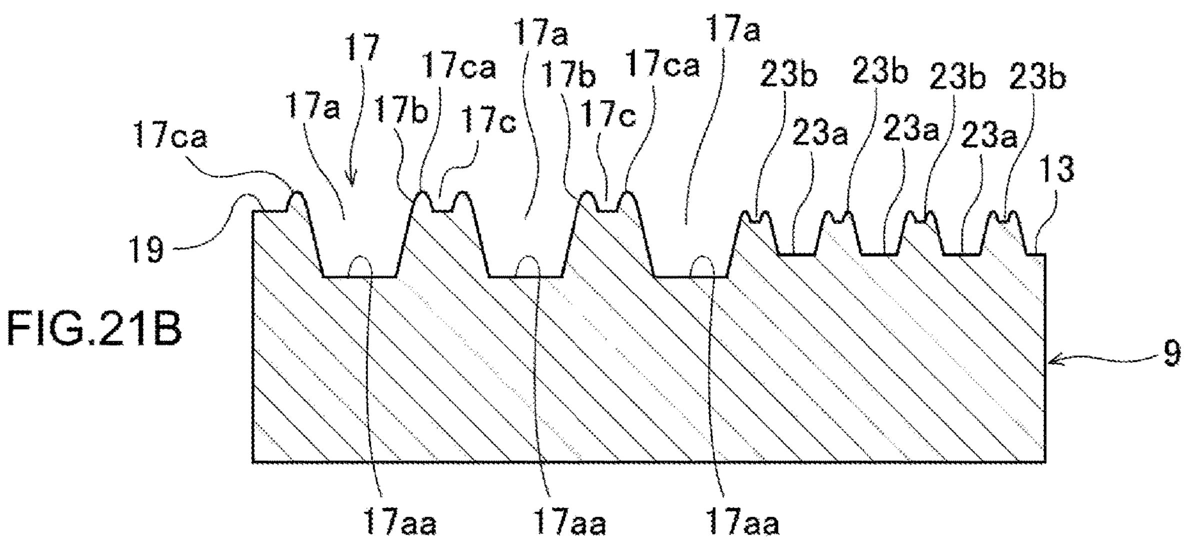
FIG. 21B is a sectional view of a part XXI of FIG. 21A.
Figure 22:
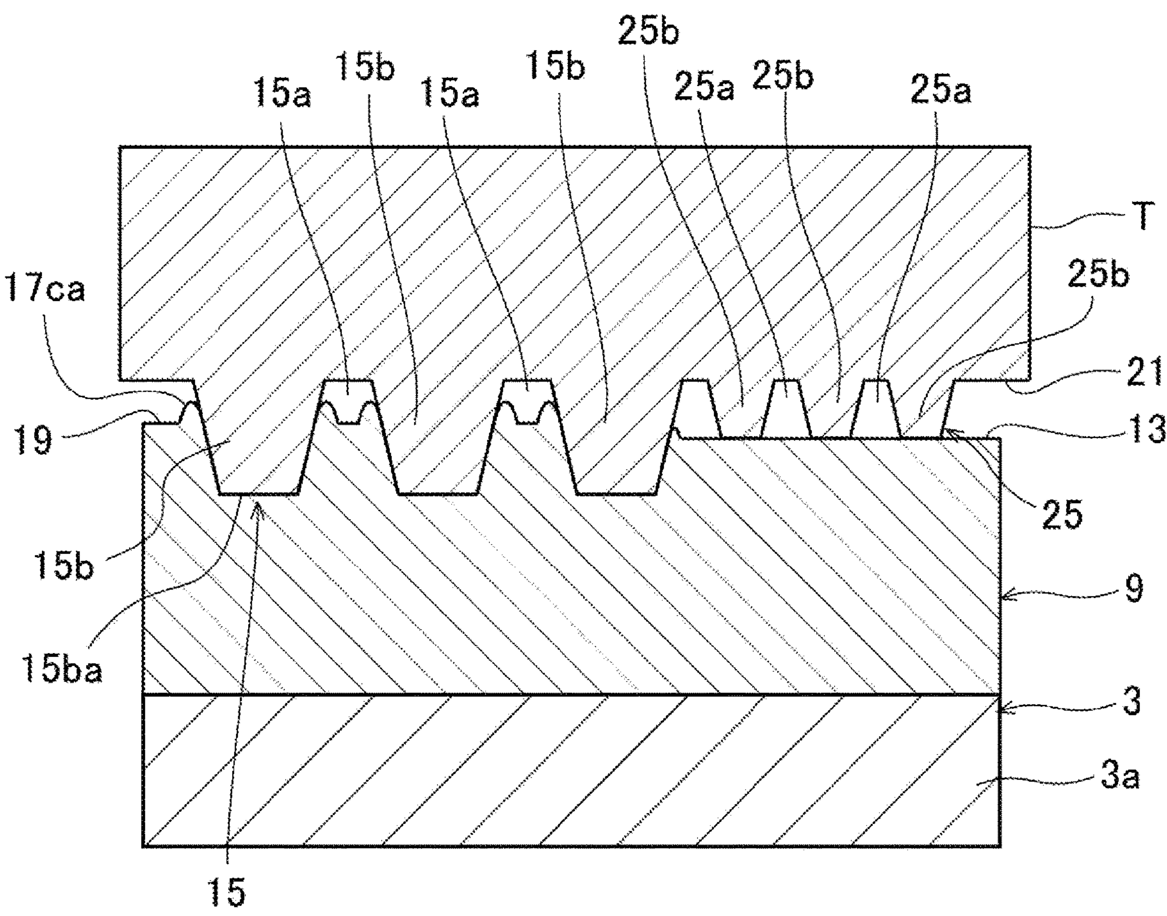
FIG. 22 is a schematic sectional view of a situation that the additional copper plate is ultrasonic-bonded to a circuit pattern according to the embodiment 5 of the present invention.

FIGS. 21A and B relate to the embodiment 5 of the present invention in which FIG. 21A is a schematic plan view of an additional copper layer before a semiconductor chip is mounted, and FIG. 21B is a sectional view of a part XXI of FIG. 21A. FIG. 22 is a schematic sectional view of a situation that the additional copper plate is ultrasonic-bonded to a circuit pattern. It should be noted that the embodiment 5 has a basic structure in common with the embodiment 1 and corresponding components are represented with the same reference numerals to eliminate repetition in description.

The present embodiment forms an attachment plane portion 13 by an uneven face having recesses and projections smaller than an engagement uneven portion 17 as illustrated in FIGS. 21A and B. Others are the same as of the embodiment 1.

The attachment plane portion 13 of the present embodiment has recesses 23*a* and projections 23*b* forming the uneven face. The recesses 23*a* and the projections 23*b* are configured similarly to the engagement recessed portions 17*a* and the engagement projected portions 17*b*, respectively and are smaller than the engagement recessed portions 17*a* and the engagement projected portions 17*b*. Although the small in this context means that the recessed portions and the projected portions are small in both a planar shape and a sectional shape, it may mean that the recessed portions and the projected portions are small in any one of the planar shape and the sectional shape.

In addition, the projection 23*b* of the attachment plane portion 13 corresponds to one in which the engagement projected portion 17*b* of FIG. 5A is made smaller, and is formed by plastically deforming an additional copper plate 9 to bulge from the attachment plane portion 13. A top of the projection 23*b* of the attachment plane portion 13 is, however, lower than the top of the engagement projected portion 17*b*. Further, the projection 23*b* of the attachment plane portion 13 may be one in which the engagement projected portion 17*b* of FIG. 4, FIG. 5B, or FIG. 12-FIG. 18B is made smaller.

The attachment plane portion 13 is formed when bonding the additional copper plate 9 on a circuit conductor 3*a* of a circuit pattern 3 according to ultrasonic vibration using a tool T as illustrated in FIG. 22. Namely, the tool T is provided with a reduction uneven portion 25 on a retracted portion 21 to reduce friction against a surface of the additional copper plate 9 in addition to the retracted portion 21 and a tool uneven portion 15 surrounding the retracted portion.

The reduction uneven portion 25 is provided with reduction recessed portions 25*a* and reduction projected portions 25*b*. The reduction recessed portions 25*a* and the reduction projected portions 25*b* are configured similarly to tool recessed portions 15*a* and tool projected portions 15*b*, a sectional shape of the reduction projected portion 25*b* is a trapezoidal shape, and a sectional shape of the reduction recessed portion 27*b* is an inverted trapezoidal shape.

The reduction recessed portions 25*a* and the reduction projected portions 25*b* are, however, smaller than the tool recessed portions 15*a* and the tool projected portions 15*b* according to the recesses 23*a* and the projections 23*b* of the attachment plane portion 13. Although the small in this context means that the reduction recessed portions and the reduction projected portions are small in both a planar shape and a sectional shape, it may mean that the reduction recessed portions and the reduction projected portions are small in any one of the planar shape and the sectional shape similarly to the recesses 23*a* and the projections 23*b*.

Figure 23:
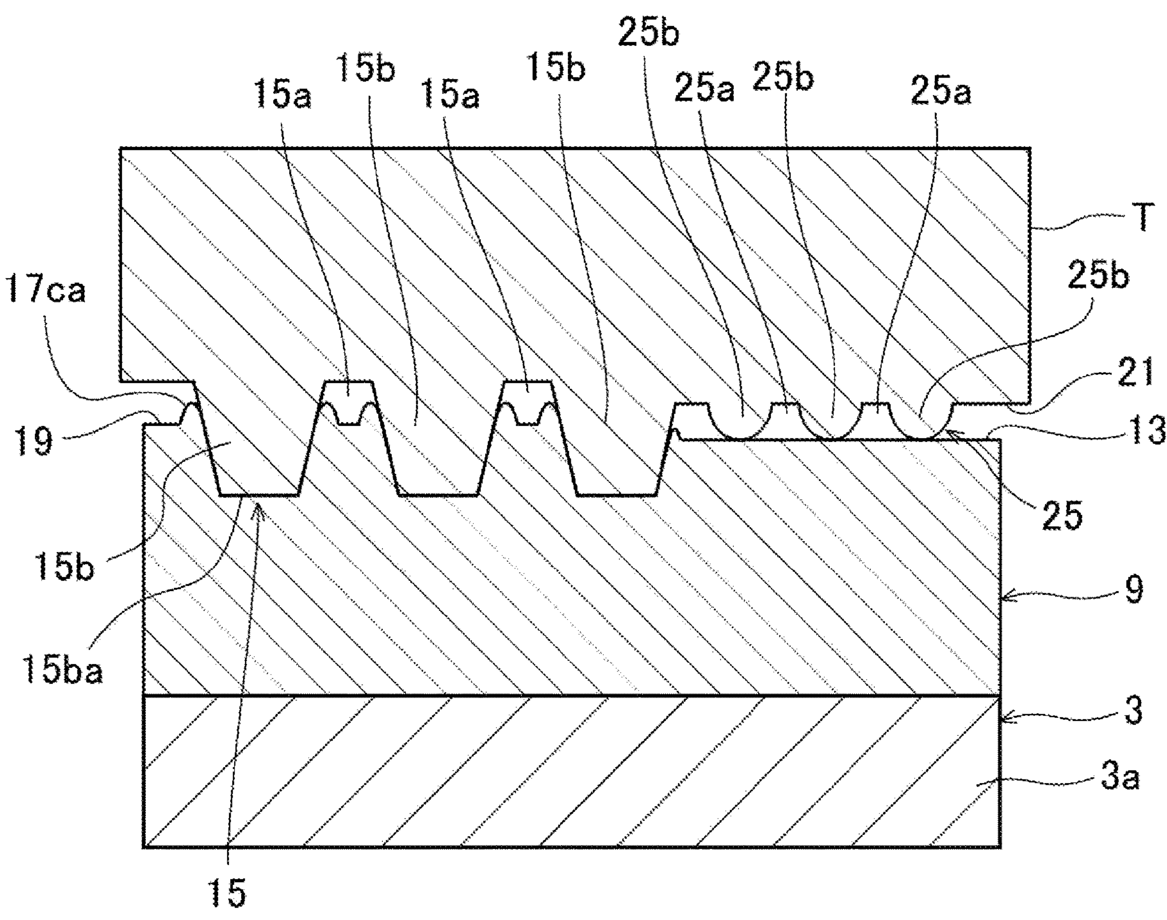
FIG. 23 is a schematic sectional view of a situation that an additional copper plate is ultrasonic-bonded to a circuit pattern according to a modification of the embodiment 5.

In addition, the reduction projected portion 25*b* of the present embodiment corresponds to one in which the tool projected portion 15*b* of FIG. 7 is made smaller according to the recess 23*a* of the attachment plane portion 13. The reduction projected portion 25*b* may be, however, one in which the other tool projected portion 15*b* of FIG. 9 or the like is made smaller according to the recess 23*a* of the attachment plane portion 13 or may have another shape or the like. For example, the reduction uneven portion 25 may be formed into a dimple shape having reduction projected portions 25*b* with projected curved faces as illustrated in FIG. 23.

The reduction uneven portion 25 contacts with the surface of the additional copper plate 9 as well as the tool uneven portion 15 when pressing the tool T against the surface of the additional copper plate 9 layered on the circuit pattern 3 to apply the ultrasonic vibration.

In an initial stage of the ultrasonic vibration, the additional copper plate 9 is integrally ultrasonic-vibrated relatively to the circuit conductor 3*a* together with the tool T. At this time, the peripheral tool uneven portion 15 presses the additional copper plate 9 while forming the engagement uneven portion 17 and the retracted portion 21 presses the additional copper plate 9 through the reduction uneven portion 25. With this, the tool T presses and ultrasonic-vibrates the additional copper plate 9 in the whole area, thereby surely bonding the additional copper plate 9 to the circuit conductor 3*a*.

After the additional copper plate 9 and the circuit conductor 3*a* are bonded together, the tool T is ultrasonic-vibrated relatively to the additional copper plate 9, and the reduction uneven portion 25 reduces friction between the retracted portion 21 of the tool T and the additional copper plate 9 at this time. As a result, temperature rise of the additional copper plate 9 is suppressed to further reduce damage of the insulating layer 7.

In addition, even the embodiment 5 provides the same effect as the embodiment 1.

Figure 24:
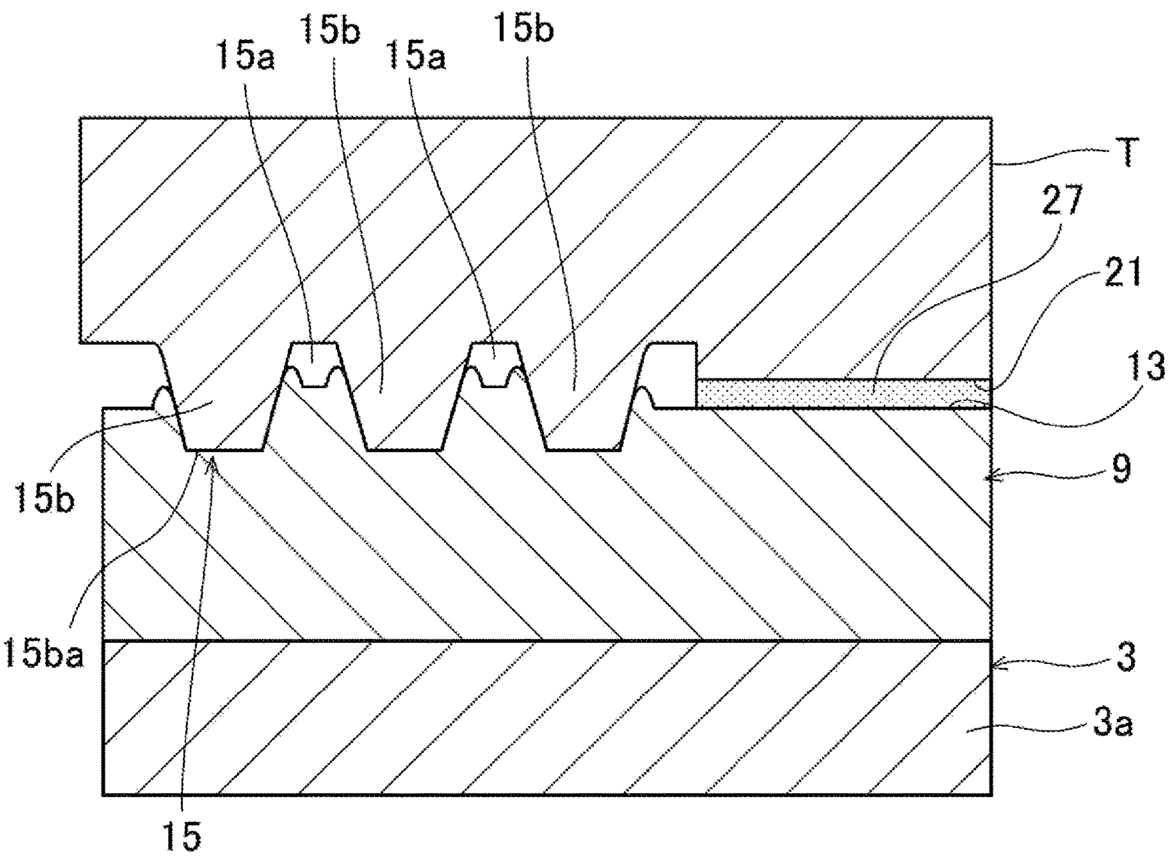
FIG. 24 is a schematic sectional view of a situation that an additional copper plate is ultrasonic-bonded to a circuit pattern according to an embodiment 6 of the present invention.

FIG. 24 is a schematic sectional view of a situation that an additional copper plate is ultrasonic-bonded to a circuit pattern according to the embodiment 6 of the present invention. It should be noted that the embodiment 6 has a basic structure in common with the embodiment 1 and corresponding components are represented with the same reference numerals to eliminate repetition in description.

The present embodiment presses a retracted portion 21 onto a surface of an additional copper plate 9 through a friction reducing material 27 at the time of ultrasonic vibration for ultrasonic-bonding the additional copper plate 9 on a circuit pattern 3 as illustrated in FIG. 24. Others are the same as of the embodiment 1.

The retracted portion 21 of the present embodiment is located so as to protrude from a bottom portion of a tool recessed portion 15*a* of a tool uneven portion 15. The friction reducing material 27 may be configured by lubricant such as grease or by a sheet causing shear deformation between the retracted portion 21 and an attachment plane portion 13. As the sheet, a ceramics fiber paper or the like may be used, the ceramics fiber paper being ceramics fibers formed into a sheet shape.

The friction reducing material 27 is interposed between the retracted portion 21 of the tool T and the surface of the additional copper plate 9 when pressing the tool T onto the surface of the additional copper plate 9 layered on the circuit pattern 3 to apply the ultrasonic vibration.

In an initial stage of the ultrasonic vibration, the additional copper plate 9 is integrally ultrasonic-vibrated relatively to the circuit conductor 3*a* together with the tool T. At this time, the peripheral tool uneven portion 15 presses the additional copper plate 9 while forming the engagement uneven portion 17 and the retracted portion 21 presses the additional copper plate 9 through the friction reducing material 27. With this, the tool T presses and ultrasonic-vibrates the additional copper plate 9 in the whole area, thereby surely bonding the additional copper plate 9 to the circuit conductor 3*a*.

After the additional copper plate 9 and the circuit conductor 3*a* are bonded together, the tool T is ultrasonic-vibrated relatively to the additional copper plate 9, and the friction reducing material 27 reduces friction between the retracted portion 21 of the tool T and the additional copper plate 9 at this time. As a result, temperature rise of the additional copper plate 9 is suppressed to further reduce damage of the insulating layer 7.

In addition, even the embodiment 6 provides the same effect as the embodiment 1.

The invention claimed is:

1. A circuit board comprising:

a base plate, a circuit pattern and an additional metal layer layered in this order, the additional metal layer layered and bonded on a partial area of the circuit pattern, wherein the additional metal layer comprises:

an attachment plane portion provided on a surface of the additional metal layer and configured to fix an electronic component using solder; and an engagement uneven portion provided adjacent to the attachment plane portion on the surface of the additional metal layer to be engaged with a tool uneven portion of a tool for vibration transmission to bond the additional metal layer on the circuit pattern with ultrasonic vibration, wherein the attachment plane portion is a face having unevenness smaller than the engagement uneven portion.

2. The circuit board according to claim 1, wherein the attachment plane portion is a flat surface.

3. The circuit board according to claim 1, wherein the attachment plane portion is an uneven face having unevenness smaller than the engagement uneven portion.

4. The circuit board according to claim 1, wherein the engagement uneven portion is provided on a whole or part of a circumference surrounding the attachment plane portion.

5. The circuit board according to claim 1, wherein the engagement uneven portion is provided intermittently or successively with engagement recessed portions and engagement projected portions.

6. The circuit board according to claim 5, wherein in the engagement recessed portions and the engagement projected portions intermittently provided, engagement recessed portions and engagement projected portions adjacent to each other are aligned or positionally displaced.

7. The circuit board according to claim 1, wherein the engagement uneven portion is provided with engagement projected portions projecting from the attachment plane portion.

8. The circuit board according to claim 7, wherein the engagement projected portions are bulged from the attachment plane portion by plastically deforming the additional metal layer.

9. The circuit board according to claim 7, wherein the engagement projected portion has a recess or a flat face on a top.

10. The circuit board according to claim 1, wherein the engagement uneven portion is indentation of the tool uneven portion.

11. The circuit board according to claim 1, wherein the engagement uneven portion has tilted side faces.

12. A manufacturing method for the circuit board according to claim 1, comprising:

layering the additional metal layer on a partial area of the circuit pattern; and pressing a tool onto a surface of the additional metal layer to apply ultrasonic vibration, the tool having a retracted portion and a tool uneven portion corresponding to the attachment plane portion and the engagement uneven portion, thereby bonding the additional metal layer on the circuit pattern due to transmission of the ultrasonic vibration while leaving the attachment plane portion on the surface of the additional metal layer in an area according to the retracted portion and forming the engagement uneven portion on the surface of the additional metal layer according to the tool uneven portion.

13. The manufacturing method of the circuit board according to claim 12, wherein interposing a friction reducing material between the retracted portion and the surface of the additional metal layer at the time of the ultrasonic vibration, to press the retracted portion onto the surface of the additional metal layer through the friction reducing material.

14. The manufacturing method of the circuit board according to claim 12, wherein the retracted portion has a reduction uneven portion to reduce friction against the surface of the additional metal layer, and the reduction uneven portion is pressed onto the surface of the additional metal layer.

15. The manufacturing method of the circuit board according to claim 12, wherein pressing load of the tool pressed onto the surface of the additional metal layer is in a degree to bulge the engagement projected portions of the engagement uneven portion from the attachment plane portion by plastically deforming the additional metal layer.

16. The manufacturing method according to claim 15, wherein the pressing load of the tool is in a degree to form the recess or a flat face on the top of the engagement projected portion of the engagement uneven portion.

17. A circuit board comprising:

a base plate, a circuit pattern and an additional metal layer layered in this order, the additional metal layer layered and bonded on a partial area of the circuit pattern, wherein the additional metal layer comprises:

an attachment plane portion provided on a surface of the additional metal layer; and an engagement uneven portion provided adjacent to the attachment plane portion on the surface of the additional metal layer to be engaged with a tool uneven portion of a tool for vibration transmission to bond the additional metal layer on the circuit pattern with ultrasonic vibration, wherein the attachment plane portion is a face having unevenness smaller than the engagement uneven portion.

* * * * *